(12) United States Patent
Park et al.

(10) Patent No.: US 11,848,338 B2
(45) Date of Patent: Dec. 19, 2023

(54) IMAGE SENSOR

(71) Applicant: SAMSUNG ELECTRONICS CO., LTD., Suwon-si (KR)

(72) Inventors: Eunji Park, Yongin-si (KR); Hyungjin Bae, Suwon-si (KR); Moosup Lim, Yongin-si (KR); Seungho Shin, Asan-si (KR); Kangsun Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 201 days.

(21) Appl. No.: 17/313,601

(22) Filed: May 6, 2021

(65) Prior Publication Data
US 2022/0123033 A1  Apr. 21, 2022

(30) Foreign Application Priority Data

Oct. 16, 2020  (KR) .......................... 10-2020-0134017

(51) Int. Cl.
*H01L 27/146* (2006.01)
*H04N 23/73* (2023.01)
(Continued)

(52) U.S. Cl.
CPC .... *H01L 27/14605* (2013.01); *H01L 27/1463* (2013.01); *H01L 27/14621* (2013.01);
(Continued)

(58) Field of Classification Search
CPC .. H04N 5/2353; H04N 5/2355; H04N 5/2357; H04N 5/3559; H04N 5/363;
(Continued)

(56) References Cited

U.S. PATENT DOCUMENTS 9,578,223 B2  2/2017  Luo et al.
9,774,801 B2  9/2017  Hseih et al.
(Continued)

FOREIGN PATENT DOCUMENTS

| KR | 10-2011-0037187 A | 4/2011 |
| KR | 10-1536323 B1 | 7/2015 |
| KR | 10-2016-0027717 A | 3/2016 |

*Primary Examiner* — Lin Ye
*Assistant Examiner* — John H Morehead, III
(74) *Attorney, Agent, or Firm* — Sughrue Mion, PLLC

(57) ABSTRACT

An image sensor includes a plurality of first photodiodes included in a first area of a unit pixel, and configured to generate electric charges, a second photodiode included in a second area of the unit pixel, and configured to generate electric charges, a first microlens disposed above the first area, a second microlens disposed above the second area, a first floating diffusion region included in the first area, a second floating diffusion region included in the second area, a plurality of first transfer transistors configured to provide the electric charges generated by the plurality of first photodiodes to the first floating diffusion region, and a second transfer transistor configured to provide the electric charges generated by the second photodiode to the second floating diffusion region. A sum of light-receiving areas of the plurality of first photodiodes is greater than a light-receiving area of the second photodiode.

20 Claims, 32 Drawing Sheets

(51) Int. Cl.
*H04N 23/741* (2023.01)
*H04N 23/745* (2023.01)

(52) U.S. Cl.
CPC .. *H01L 27/14627* (2013.01); *H01L 27/14645* (2013.01); *H04N 23/73* (2023.01); *H04N 23/741* (2023.01); *H04N 23/745* (2023.01)

(58) Field of Classification Search
CPC ............ H04N 5/3741; H01L 27/14605; H01L 27/14621; H01L 27/14627; H01L 27/1463; H01L 27/14645; H01L 27/14654; H01L 27/14612; H01L 27/1464; H01L 27/14641; H01L 27/1461
See application file for complete search history.

(56) References Cited

U.S. PATENT DOCUMENTS

| | | | |
|---|---|---|---|
| 9,911,773 | B2 | 3/2018 | Yang et al. |
| 10,015,428 | B2 | 7/2018 | Lee et al. |
| 10,334,191 | B1 | 6/2019 | Yang et al. |
| 11,343,451 | B2 * | 5/2022 | Ishiwata ............... H04N 25/771 |
| 2016/0286108 | A1 * | 9/2016 | Fettig ................... H04N 25/704 |
| 2017/0053956 | A1 * | 2/2017 | Nakamura ........ H01L 27/14605 |
| 2017/0104942 | A1 * | 4/2017 | Hirota ............... H01L 27/14627 |
| 2017/0221947 | A1 * | 8/2017 | Shishido ........... H01L 27/14609 |
| 2018/0213205 | A1 * | 7/2018 | Oh .................... H01L 27/14627 |
| 2018/0367747 | A1 * | 12/2018 | Mo ..................... H01L 27/1461 |
| 2019/0229138 | A1 * | 7/2019 | Lee ........................ H04N 25/53 |
| 2020/0186731 | A1 * | 6/2020 | Chen ................... H04N 25/778 |
| 2020/0252559 | A1 * | 8/2020 | Johnson ............... H04N 25/616 |
| 2020/0369371 | A1 * | 11/2020 | Ishiwata .............. H04N 25/771 |

* cited by examiner

IMAGE SENSOR

CROSS-REFERENCE TO RELATED APPLICATION

This application is based on and claims priority under 35 U.S.C. § 119 to Korean Patent Application No. 10-2020-0134017 filed on Oct. 16, 2020, in the Korean Intellectual Property Office, the disclosure of which is incorporated by reference herein in its entirety.

BACKGROUND

The disclosure relates to an image sensor.

Image sensors are semiconductor-based sensors receiving light and generating electrical signals, and may include pixel arrays including a plurality of pixels, and circuits for driving the pixel arrays and generating images. Each of the plurality of pixels may include a photodiode generating an electric charge in response to external light, and a pixel circuit converting the electric charge generated by the photodiode into an electric signal. Image sensors may be widely applied to smartphones, tablet PCs, laptop computers, televisions, and automobiles, as well as cameras for capturing images and/or videos. In recent years, along with research to improve a dynamic range of an image sensor, research has been actively undertaken to accurately detect light from a light source in which a flicker phenomenon occurs. However, as pixel size has been miniaturized, there has been a problem in which noise of an image sensor increases.

SUMMARY

Provided is an image sensor reducing noise, and accurately detecting light from an external light source such as a semiconductor light emitting device (LED) or the like to generate an image.

According to embodiments, an image sensor includes a plurality of first photodiodes included in a first area of a unit pixel, a second photodiode included in a second area of the unit pixel, a first microlens disposed above the first area, a second microlens disposed above the second area, a first floating diffusion region included in the first area, a second floating diffusion region included in the second area, a plurality of first transfer transistors configured to provide electric charges generated by the plurality of first photodiodes to the first floating diffusion region, and a second transfer transistor configured to provide electric charges generated by the second photodiode to the second floating diffusion region. A sum of light-receiving areas of the plurality of first photodiodes is greater than a light-receiving area of the second photodiode.

According to embodiments, an image sensor includes a plurality of first photodiodes connected to a first floating diffusion region, respectively via a plurality of first transfer transistors, a second photodiode connected to a second floating diffusion region separate from the first floating diffusion region, via a second transfer transistor, a first reset transistor connected between the second floating diffusion region and a first power node, a second reset transistor connected between the first floating diffusion region and the second floating diffusion region, a switching element connected between the second transfer transistor and the second floating diffusion region, and a storage capacitor connected between a second power node and a node interposed between the second transfer transistor and the switching element. The plurality of first photodiodes and the second photodiode are included for each unit pixel.

According to embodiments, an image sensor includes N first photodiodes included in a unit pixel, a second photodiode included in the unit pixel, a color filter disposed above and shared by the N first photodiodes and the second photodiode, M first microlenses disposed above the N first photodiodes, where M is less than or equal to N, a second microlens disposed above the second photodiode, a first floating diffusion region, a second floating diffusion region separate from the first floating diffusion region, a plurality of first transfer transistors configured to provide electric charges that are accumulated in the N first photodiodes, to the first floating diffusion region, and a second transfer transistor configured to provide electric charges that are accumulated in the second photodiode, to the second floating diffusion region.

BRIEF DESCRIPTION OF THE DRAWINGS

The above and other aspects, features, and advantages of embodiments of the disclosure will be more apparent from the following description taken in conjunction with the accompanying drawings, in which.

DETAILED DESCRIPTION

Figure 1:
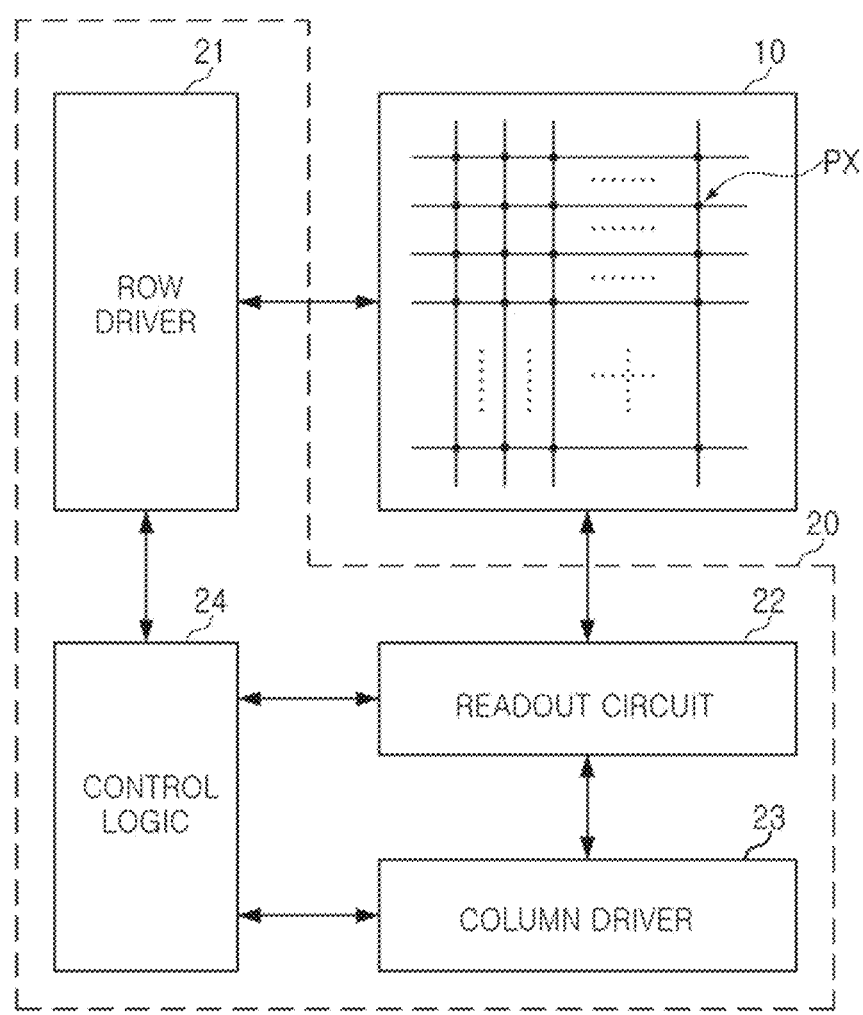
FIG. 1 is a schematic block diagram of an image sensor according to embodiments.

FIG. 1 is a schematic block diagram of an image sensor according to embodiments.

Referring to FIG. 1, an image sensor 1 according to embodiments may include a pixel array 10 and a logic circuit 20.

The pixel array 10 may include a plurality of pixels PX disposed in an array shape in a plurality of rows and a plurality of columns. Each of the plurality of pixels PX may include at least one photoelectric conversion device that generates electric charge in response to light, and a pixel circuit that generates a pixel signal corresponding to electric charge generated by the photoelectric conversion device.

The photoelectric conversion device may include a photodiode formed of a semiconductor material, and/or an organic photodiode formed of an organic material. In embodiments, each of the plurality of pixels PX may include two or more photoelectric conversion devices, and two or more photoelectric conversion devices included in one pixel PX may receive light of different colors to generate electric charges.

In embodiments, one pixel PX may include a plurality of first photodiodes and a second photodiode, and the plurality of first photodiodes and the second photodiode may receive light of different wavelength bands and may respectively generate electric charges. In embodiments, the plurality of first photodiodes may receive light before the second photodiode.

Depending on embodiments, the pixel circuit may include a transfer transistor, a driving transistor, a selection transistor, and a reset transistor. When one pixel PX has two or more photoelectric conversion devices, the pixel PX may include a pixel circuit for processing electric charges generated by each of the two or more photoelectric conversion devices. For example, when one pixel PX has two or more photoelectric conversion devices, the pixel circuit may include two or more of at least a portion of the transfer transistor, the driving transistor, the selection transistor, and the reset transistor.

On the other hand, in embodiments, one pixel PX may include a first pixel circuit processing electric charges generated by the plurality of first photodiodes, and a second pixel circuit processing electric charges generated by the second photodiode. The first pixel circuit may include a plurality of first semiconductor devices, and the second pixel circuit may include a plurality of second semiconductor devices. The first pixel circuit may generate first electrical signals from electric charges generated by the plurality of first photodiodes and may output the first electrical signal to a first column line, and the second pixel circuit may generate a second electrical signal from the electric charges generated by the second photodiode and may output the second electrical signal to a second column line.

In embodiments, two or more first pixel circuits disposed adjacent to each other may share one first column line. Similarly, two or more second pixel circuits disposed adjacent to each other may share one second column line. The second pixel circuits disposed adjacent to each other may share a portion of the second semiconductor device.

The logic circuit 20 may include circuits for controlling the pixel array 10. For example, the logic circuit 20 may include a row driver 21, a readout circuit 22, a column driver 23, and a control logic 24.

The row driver 21 may drive the pixel array 10 in a row unit. For example, the row driver 21 may generate a transmission control signal for controlling the transfer transistor of a pixel circuit, a reset control signal for controlling the reset transistor, a selection control signal for controlling the selection transistor, and the like, to input the generated signals to the pixel array 10 in the unit of a row.

The readout circuit 22 may include a correlated double sampler (CDS), an analog-to-digital converter (ADC), and the like. The correlated double samplers may be connected to the pixels PX through column lines. The correlated double samplers may perform correlated double sampling by receiving pixel signals from pixels PX connected to a row line selected by a row line selection signal of the row driver 21. The pixel signal may be received through column lines. The analog-to-digital converter may convert the pixel signal detected by the correlated double sampler into a digital pixel signal and transmit the converted signal to the column driver 23.

The column driver 23 may include a buffer circuit, an amplifying circuit or a latch for temporarily storing a digital pixel signal, and may process a digital pixel signal received from the readout circuit 22. The row driver 21, the readout circuit 22 and the column driver 23 may be controlled by the control logic 24. The control logic 24 may include a timing controller for controlling the operation timing of the row driver 21, the readout circuit 22, and the column driver 23, or the like.

Among the pixels PX, pixels PX disposed in the same position in the horizontal direction may share the same column line. For example, pixels PX disposed in the same position in the vertical direction are simultaneously selected by the row driver 21 and may output pixel signals through column lines. In embodiments, the readout circuit 22 may simultaneously acquire pixel signals from the pixels PX selected by the row driver 21 through column lines. The pixel signal may include a reset voltage and a pixel voltage, and the pixel voltage may be a voltage in which electric charges generated in response to light in each of the pixels PX are reflected in the reset voltage.

Figure 2:
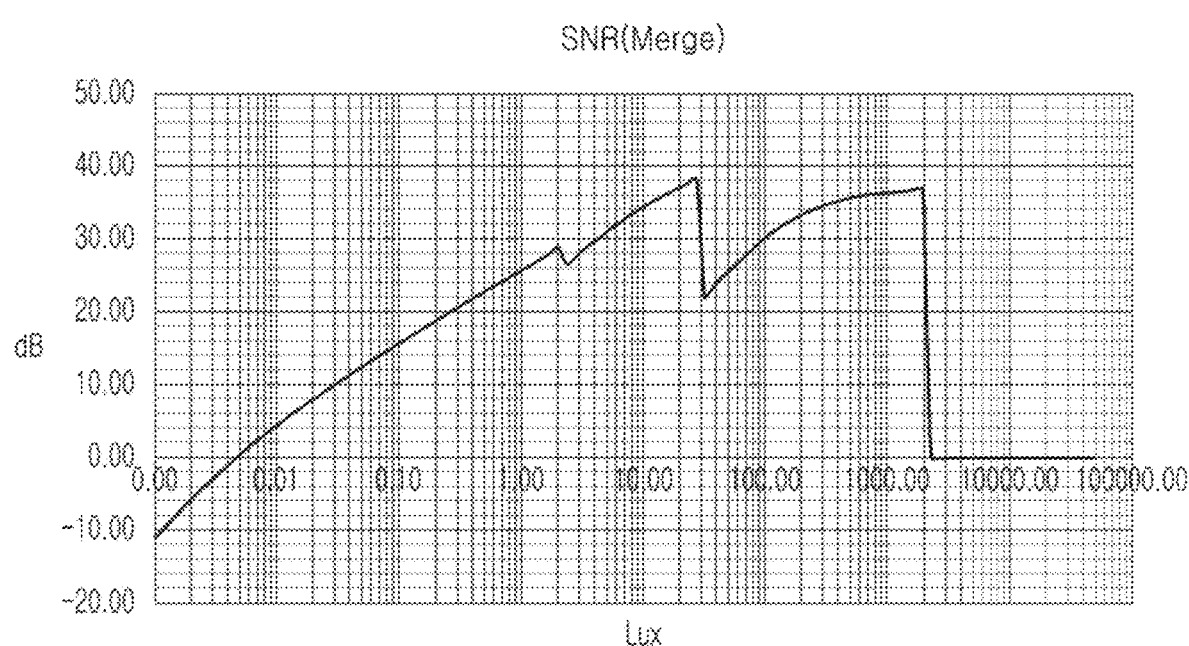
FIG. 2 is a diagram illustrating an effect of an image sensor according to embodiments.

FIG. 2 is a diagram illustrating an effect of an image sensor according to embodiments.

An image sensor according to embodiments may include a first photodiode and a second photodiode for each unit pixel. For example, the first photodiode may have a larger light receiving area than that of the second photodiode. On the other hand, the image sensor may generate an image using the first photodiode and the second photodiode, and roles of the first photodiode and the second photodiode may be different. For example, the first photodiode having a relatively large light-receiving area may be used for generating an image. The second photodiode having a relatively small light-receiving area may be used for accurately detecting an external light source having a flicker phenomenon, or may be used for auxiliary use in image creation. Accordingly, when the image sensor according to embodiments is applied to an autonomous vehicle, the image sensor may accurately detect a headlamp and a tail lamp of a nearby vehicle, or a traffic light employing a flicker-generating LED as a light source.

The image sensor according to embodiments may accurately capture an external light source in which flicker occurs. On the other hand, to use a high-pixel image sensor for recognizing an object over a long distance, the size of a pixel included in the image sensor may be reduced. Accordingly, the Full Well Capacity (FWC) of the first photodiode related to image generation may be reduced.

Referring to FIG. 2, as the FWC of the first photodiode decreases, when combining the pixel signal generated by the first photodiode and the pixel signal generated by the second photodiode, an SNR dip phenomenon in which the signal-to-noise ratio (SNR) rapidly decreases may occur in an illuminance section. To reduce the SNR dip phenomenon, the FWC of the first photodiode that generates an image may be increased, or the capacity of the second photodiode to alleviate the flicker phenomenon may be increased. However, when the capacity of the second photodiode is increased, reset noise may increase. Accordingly, a method of increasing the FWC of the first photodiode may be required.

The image sensor according to embodiments may increase the FWC of the first photodiode by dividing the first photodiode and the first transfer transistor connected to the first photodiode into a plurality of pieces. For example, when the first photodiode and the first transfer transistor connected to the first photodiode are divided into a plurality, a moving distance of electric charges moving from each of the divided first photodiodes to a first floating diffusion region may decrease. Accordingly, electric charge remaining in the first photodiode may be significantly reduced, the FWC of the first photodiode may be increased, and further, the SNR dip phenomenon may be reduced.

Figure 3A:
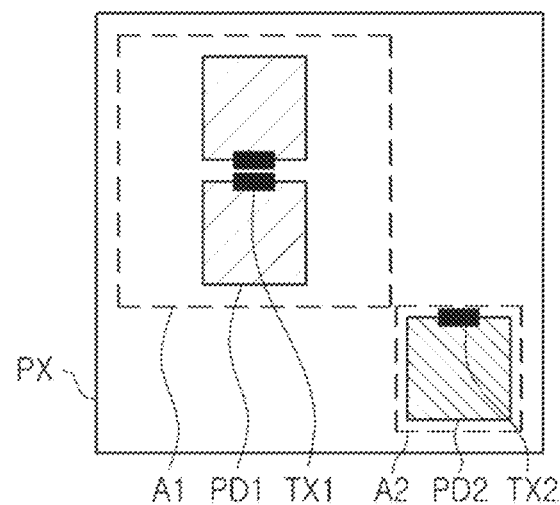
FIGS. 3A, 3B and 3C are schematic plan views illustrating a pixel included in an image sensor according to embodiments.
Figure 3B:
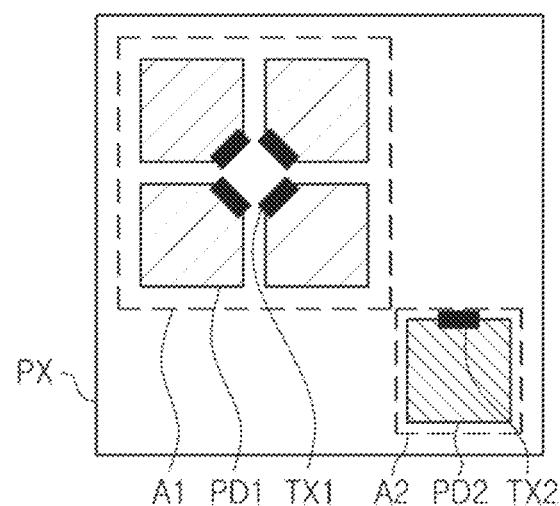
Figure 3C:
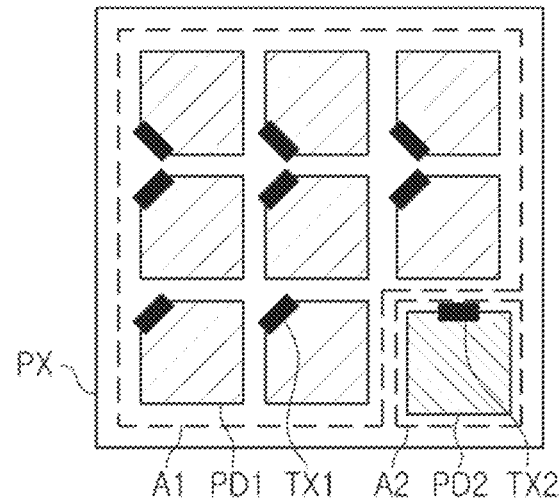

FIGS. 3A, 3B and 3C are schematic plan views illustrating a pixel included in an image sensor according to embodiments.

Referring to FIGS. 3A to 3C, a pixel array of an image sensor according to embodiments may include a plurality of pixels PX. For example, each of the plurality of pixels PX may include a photodiode that receives light to generate electric charge, and a plurality of semiconductor devices that convert electric charge generated by the photodiode into an electric signal.

For example, the pixel PX may include a plurality of first photodiodes PD1 and a second photodiode PD2. The plurality of first photodiodes PD1 may be disposed adjacent to each other in a first area A1 on the X-Y plane. On the other hand, the second photodiode PD2 may be disposed in a second area A2 spaced apart from the first area A1.

In embodiments, the sum of light-receiving areas of the plurality of first photodiodes PD1 may be greater than a light-receiving area of the second photodiode PD2. Accordingly, the second photodiode PD2 may be more easily saturated than the plurality of first photodiodes PD1. In embodiments, a means for preventing saturation of the second photodiode PD2 may be provided to prevent erroneous detection of light from traffic lights and/or surrounding vehicles using LEDs as light sources due to saturation of the second photodiode PD2.

On the other hand, the number of first photodiodes PD1 included in one pixel PX may not be limited. For example, the embodiments illustrated in FIGS. 3A, 3B and 3C illustrate that two, four, and eight first photodiodes PD1 are included in one pixel PX, respectively, but the configuration is not limited thereto. As an example, the plurality of first photodiodes PD1 included in the first area A1 and the second photodiode PD2 included in the second area A2, in one pixel PX, may be disposed to significantly reduce the area of the pixel PX.

A plurality of semiconductor devices that convert electric charges generated by the photodiode into an electric signal may include a plurality of transfer transistors. The plurality of transfer transistors may include a plurality of first transfer transistors TX1 connected to the plurality of first photodiodes PD1, and a second transfer transistor TX2 connected to the second photodiode PD2. For example, the plurality of first transfer transistors TX1 may be connected to the plurality of first photodiodes PD1, respectively. One first photodiode PD1 may be connected to one first transfer transistor TX1.

In the image sensor according to the example embodiment, the plurality of first transfer transistors TX1 may provide electric charges generated by the plurality of first photodiodes PD1 to the first floating diffusion region, respectively. For example, the plurality of first photodiodes PD1 may share the first floating diffusion region. On the other hand, the second transfer transistor TX2 may provide electric charge generated by the second photodiode PD2 to a second floating diffusion region.

According to the operation of the image sensor according to the example embodiment, electric charges generated by the plurality of first photodiodes PD1 may move from the plurality of first photodiodes PD1 to the first floating diffusion region. The plurality of first transfer transistors TX1 may be disposed in positions capable of significantly reducing a movement path of electric charges generated by the plurality of first photodiodes PD1. For example, the plurality of first transfer transistors TX1 may be disposed in positions in which the distances from the plurality of first transfer transistors TX1 to the first floating diffusion region is minimal, respectively. The embodiments illustrated in FIGS. 3A to 3C may include an arrangement of a plurality of first transfer transistors TX1, but are only examples, and are not limited thereto. For example, the number and position of the first photodiodes PD1, the position of the first floating diffusion region according to the sensitivity of the image sensor, and the arrangement of a plurality of first transfer transistors TX1 according to the wiring routing method may vary.

For convenience of description, hereinafter, there may be provided a case in which four first photodiodes PD1 are included in the first area A1, and the plurality of first transfer transistors are disposed to significantly reduce the movement distance of electric charges generated by the first photodiodes PD1. For example, hereinafter, the pixel PX of the image sensor according to embodiments may have a structure of the pixel PX illustrated in FIG. 3B.

Figure 4A:
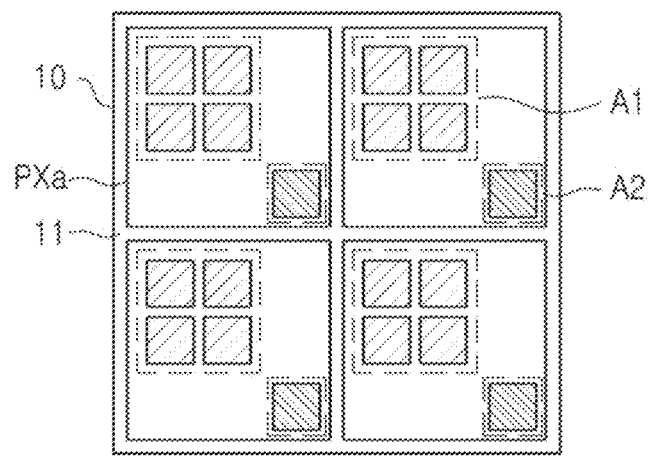
FIGS. 4A, 4B and 4C are schematic plan views illustrating a pixel array included in an image sensor according to embodiments.
Figure 4B:
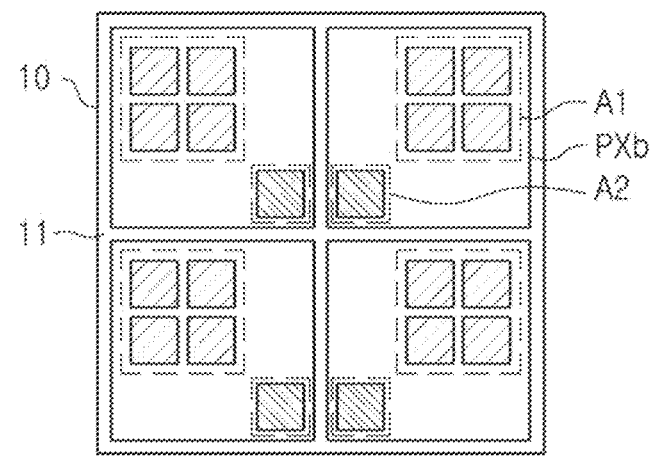
Figure 4C:
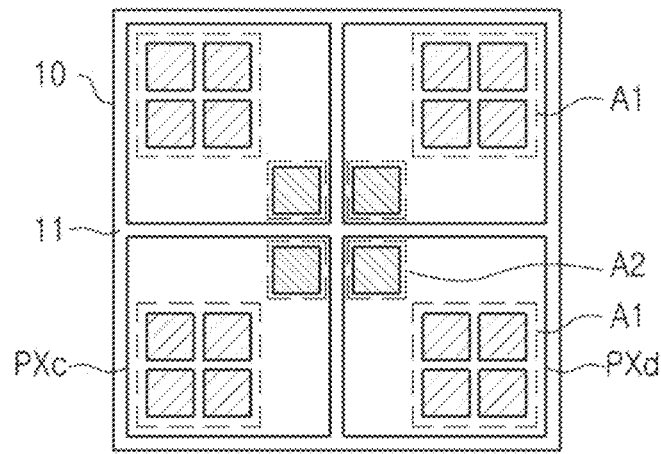

FIGS. 4A, 4B and 4C are schematic plan views illustrating a pixel array included in an image sensor according to embodiments.

Referring to FIGS. 4A, 4B and 4C, in an image sensor according to embodiments, a pixel array 10 may include a plurality of pixels PX. The plurality of pixels PXa, PXb, PXc and PXd may be disposed in a matrix form in a plurality of rows and columns on the XY plane. An isolation region 11 may be disposed between the plurality of pixels PXa, PXb, PXc and PXd to prevent cross-talk. The isolation region 11 may include an insulating material such as an oxide, and may be formed by deep trench isolation (DTI). A sidewall of the isolation region 11 adjacent to the plurality of pixels PXa, PXb, PXc and PXd may be formed of a material having relatively high reflectivity.

On the other hand, the plurality of pixels PXa, PXb, PXc and PXd may each include a plurality of first photodiodes included in a first area A1, and a second photodiode included in a second area A2. However, the arrangement of the first area A1 and the second area A2 is not limited to any one, and may be variously modified.

For example, referring to FIG. 4A, the pixel array 10 may include a plurality of pixels PXa in which the second area A2 is located at the lower right of the first area A1. Accordingly, the second areas A2 between two different pixels may not be adjacent to each other.

On the other hand, referring to FIG. 4B, the pixel array 10 may include a plurality of pixels PXa in which the second area A2 is located at the lower right of the first area A1, and a plurality of pixels PXb in which the second area A2 is located at the lower left of the first area A1. Accordingly, the second areas A2 between two different pixels may be adjacent to each other.

Further, referring to FIG. 4C, the pixel array 10 may include a plurality of pixels PXa in which the second area A2 is located on the lower right of the first area A1, a plurality of pixels PXb in which the second area A2 is located on the lower left of the first area A1, a plurality of pixels PXc in which the second area A2 is located on the upper right of the first area A1, and a plurality of pixels PXd in which the second area A2 is located on the upper left of the first area A1. Accordingly, the second areas A2 between four different pixels may be adjacent to each other.

However, the arrangement form of the plurality of pixels PXa, PXb, PXc and PXd included in the pixel array 10 is not limited to the forms illustrated in FIGS. 4A to 4C. For convenience of description, a case in which the pixel array 10 includes a plurality of pixels PXa in which both the first area A1 and the second area A2 are disposed in the same shape may be provided as an example below. For example, hereinafter, the pixel array 10 of the image sensor according to embodiments may have the structure illustrated in FIG. 4A.

Figure 5A:
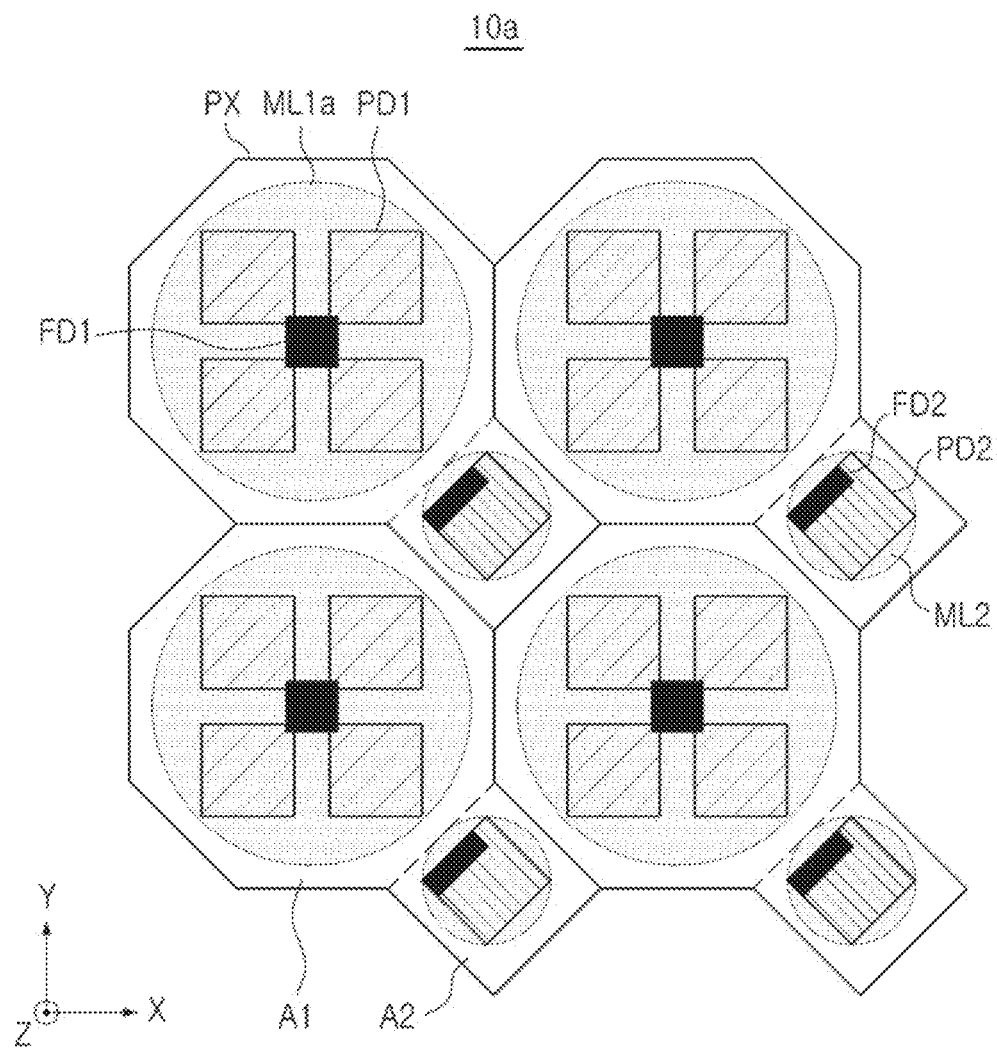
FIGS. 5A, 5B and 5C are plan views schematically illustrating pixel arrays included in an image sensor according to embodiments.
Figure 5B:
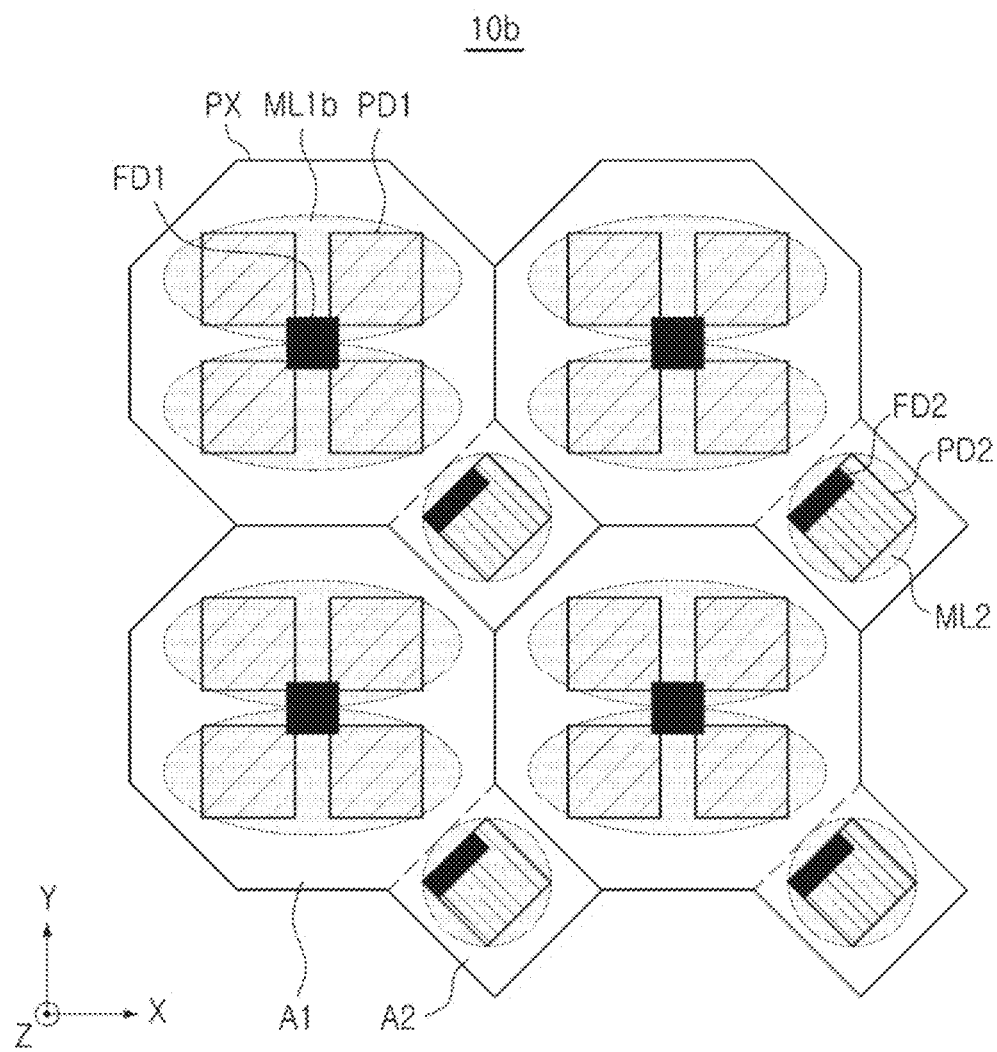
Figure 5C:
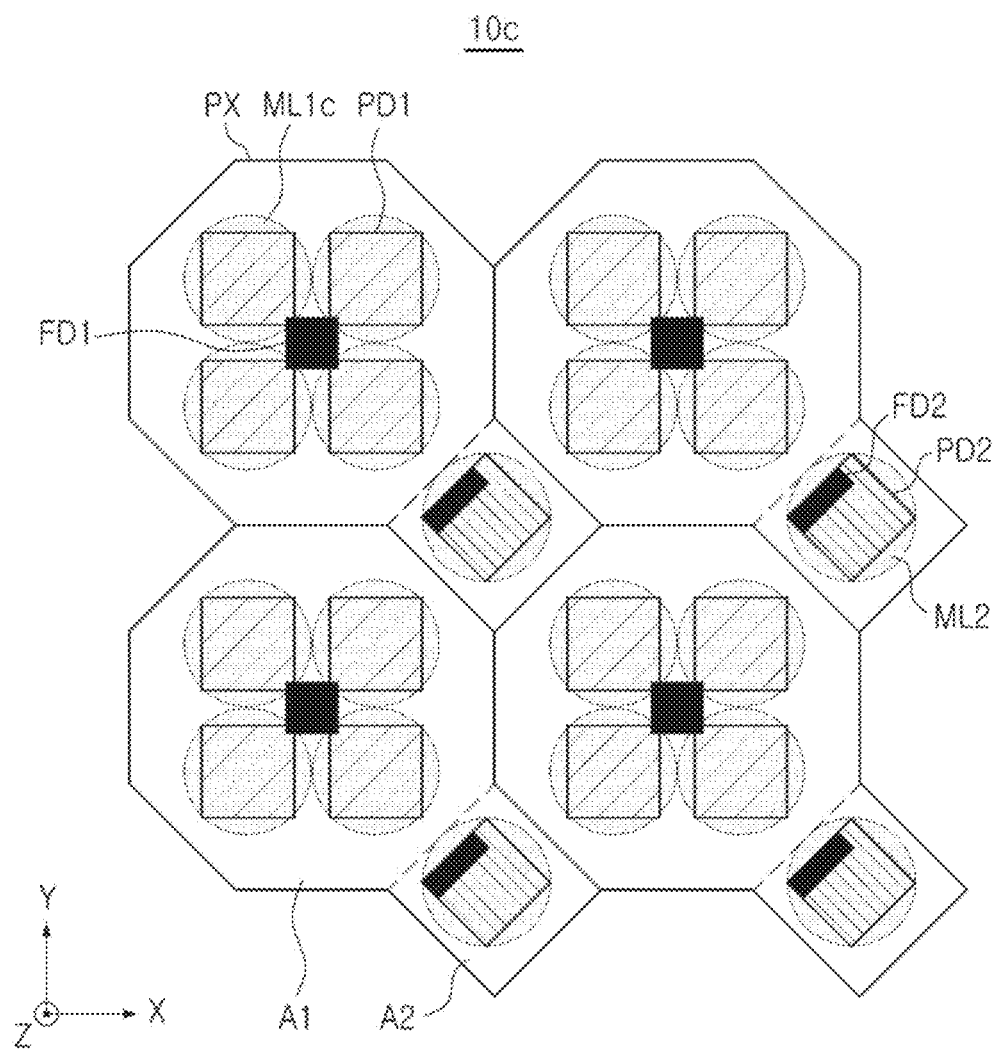

FIGS. 5A, 5B, and 5C are plan views schematically illustrating pixel arrays included in an image sensor according to embodiments.

Referring to FIGS. 5A to 5C, in an image sensor according to embodiments, pixel arrays 10a, 10b and 10c may include a plurality of pixels PX. For example, in the case of the plurality of pixels PX, for example, four different pixels, one second area A2 may be positioned between four first areas A1, and one first area A1 may be located between four second areas A2. In addition, the plurality of pixels PX may be disposed side by side in such a manner that the first area A1 has a regular octagon shape and the second area A2 has a square shape. Accordingly, the image sensor according to embodiments may improve the integration of the photodiodes, which is only embodiments and is not limited thereto. The plurality of pixels PX may be disposed in various manners and shapes.

In the image sensor according to embodiments, a plurality of pixels PX included in the pixel arrays 10a, 10b, and 10c may each include a plurality of first photodiodes PD1, a second photodiode PD2, a first floating diffusion region FD1, and a second floating diffusion region FD2. As an example, the first floating diffusion region FD1 may be disposed between the plurality of first photodiodes PD1, and the second floating diffusion region FD2 may be disposed on one side of the second photodiode PD2. However, the arrangement of the first floating diffusion region FD1 and the second floating diffusion region FD2 may not be limited to the illustration. On the other hand, the plurality of pixels PX may include a pixel circuit for generating an image by obtaining an electric signal from electric charges generated by photodiodes respectively included therein.

Photodiodes included in each of the plurality of pixels PX may generate electric charges from incident light, using a microlens respectively disposed above the photodiodes. However, in the image sensor according to embodiments, including the first photodiode PD1 in plural may be to reduce the moving distance of electric charges between the transfer transistor and the first floating diffusion region FD1 respectively included therein. Accordingly, the plurality of first photodiodes PD1 may not be individually operated by the microlenses respectively disposed thereon.

For example, in the image sensor according to embodiments, each of the plurality of first photodiodes PD1 may not require an individual microlens, and the plurality of first photodiodes PD1 may share at least one microlens, but this configuration is only embodiments and is not limited thereto. For example, the image sensor according to embodiments may include n first photodiodes. As an example, n may be a natural number other than 1. On the other hand, m first microlenses may be disposed above the n first photodiodes. For example, m may be a natural number less than or equal to n.

Referring to FIG. 5A, in the pixel array 10a included in the image sensor according to embodiments, the plurality of pixels PX may each further include one first microlens ML1a disposed above the first area A1 including a plurality of first photodiodes PD1, and in addition, may further include a second microlens ML2 disposed above the second area A2 including the second photodiode PD2.

As described above, because the sum of light-receiving areas of the plurality of first photodiodes PD1 is larger than a light-receiving area of the second photodiode PD2, the area of the microlens ML1a disposed above the first photodiode PD1 may be larger than the area of the second microlens ML2 disposed above the second photodiode PD2.

On the other hand, in the pixel array 10a illustrated in FIG. 5A, one first microlens ML1a may be disposed above the four first photodiodes PD1. In this case, a first floating diffusion region FD1 may be disposed between the four first photodiodes PD1. Accordingly, the center point of the first microlens ML1a may overlap the first floating diffusion region FD1 in the vertical direction (e.g., Z-direction). On the other hand, when the center point of the first microlens ML1a and the first floating diffusion region FD1 overlap in the vertical direction, the sensitivity of the image sensor may decrease. For example, by increasing the number of the first microlenses ML1a, a decrease in sensitivity of the image sensor may be prevented, but this is only embodiments and is not limited thereto, and various other methods for improving the sensitivity of the image sensor may be used.

Referring to FIG. 5B, in the pixel array 10b included in the image sensor according to embodiments, each of a plurality of pixels PX may further include two first microlenses ML1b disposed above the first area A1 including a plurality of first photodiodes PD1, and in addition, may further include one second microlens ML2 disposed above the second area A2 including a second photodiode PD2.

Each of the plurality of pixels PX may include two first microlenses ML1b, and the center point of each first microlens ML1b and the first floating diffusion region FD1 may not overlap in the vertical direction (e.g., Z-direction). Accordingly, a decrease in sensitivity of the image sensor according to embodiments may be prevented.

On the other hand, referring to FIG. 5C, in the pixel array 10c included in the image sensor according to the example embodiment, each of a plurality of pixels PX may further include four first microlenses ML1c disposed above the first area A1 including a plurality of first photodiodes PD1, and in addition, may further include one second microlens ML2 disposed above the second area A2 including the second photodiode PD2.

Figure 6:
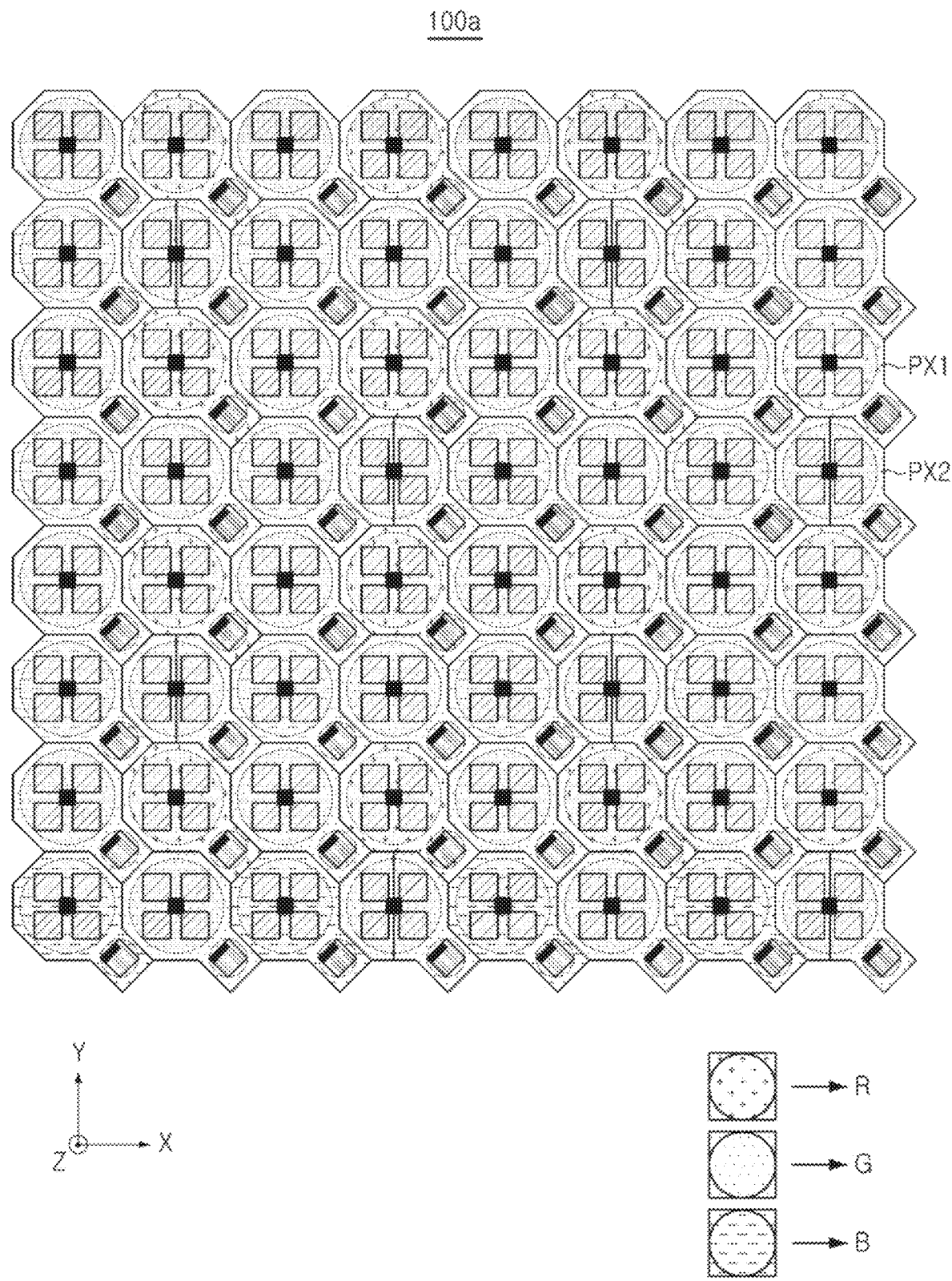
FIGS. 6, 7 and 8 are plan views schematically illustrating a pixel array included in an image sensor according to embodiments.
Figure 7:
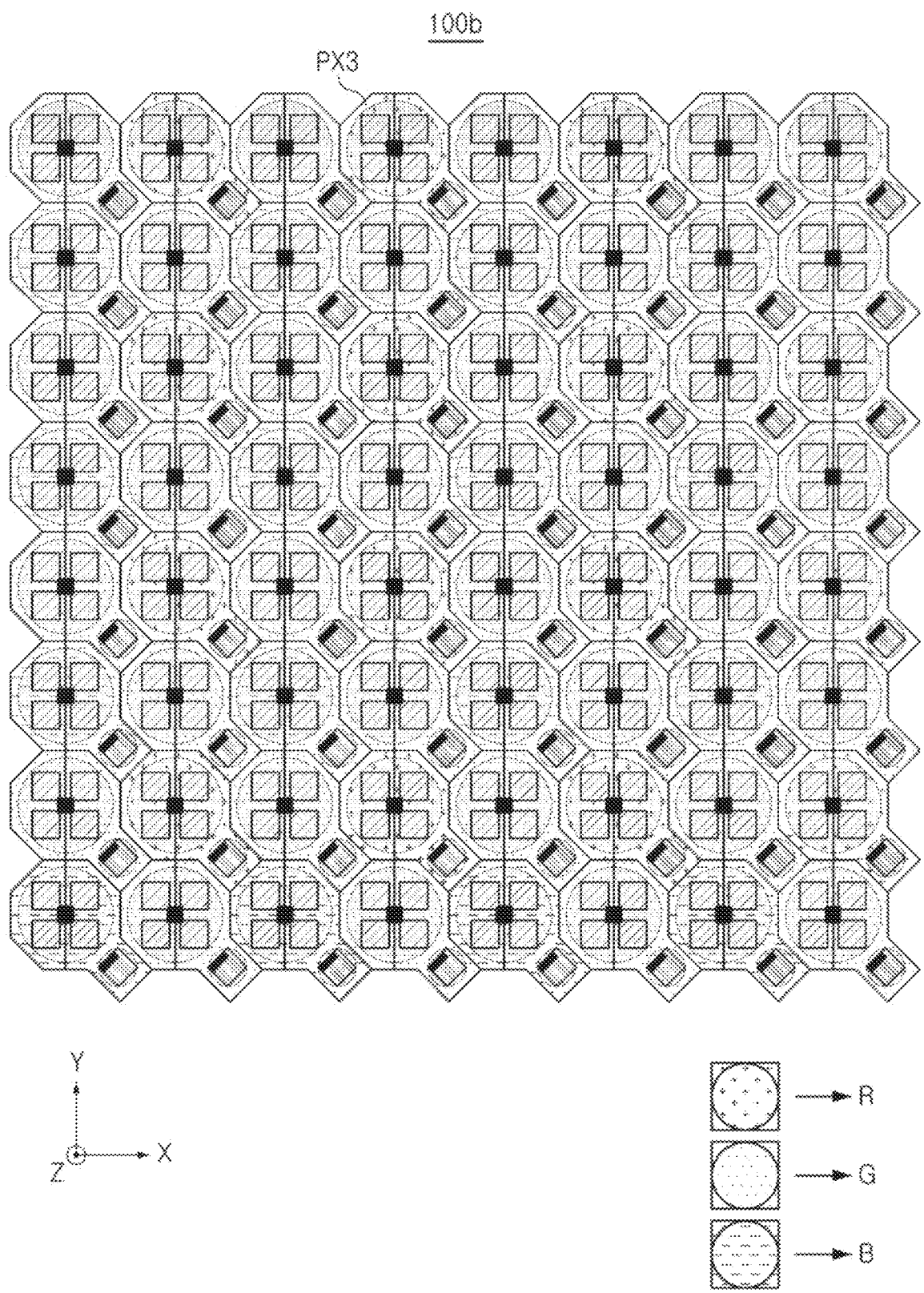
Figure 8:
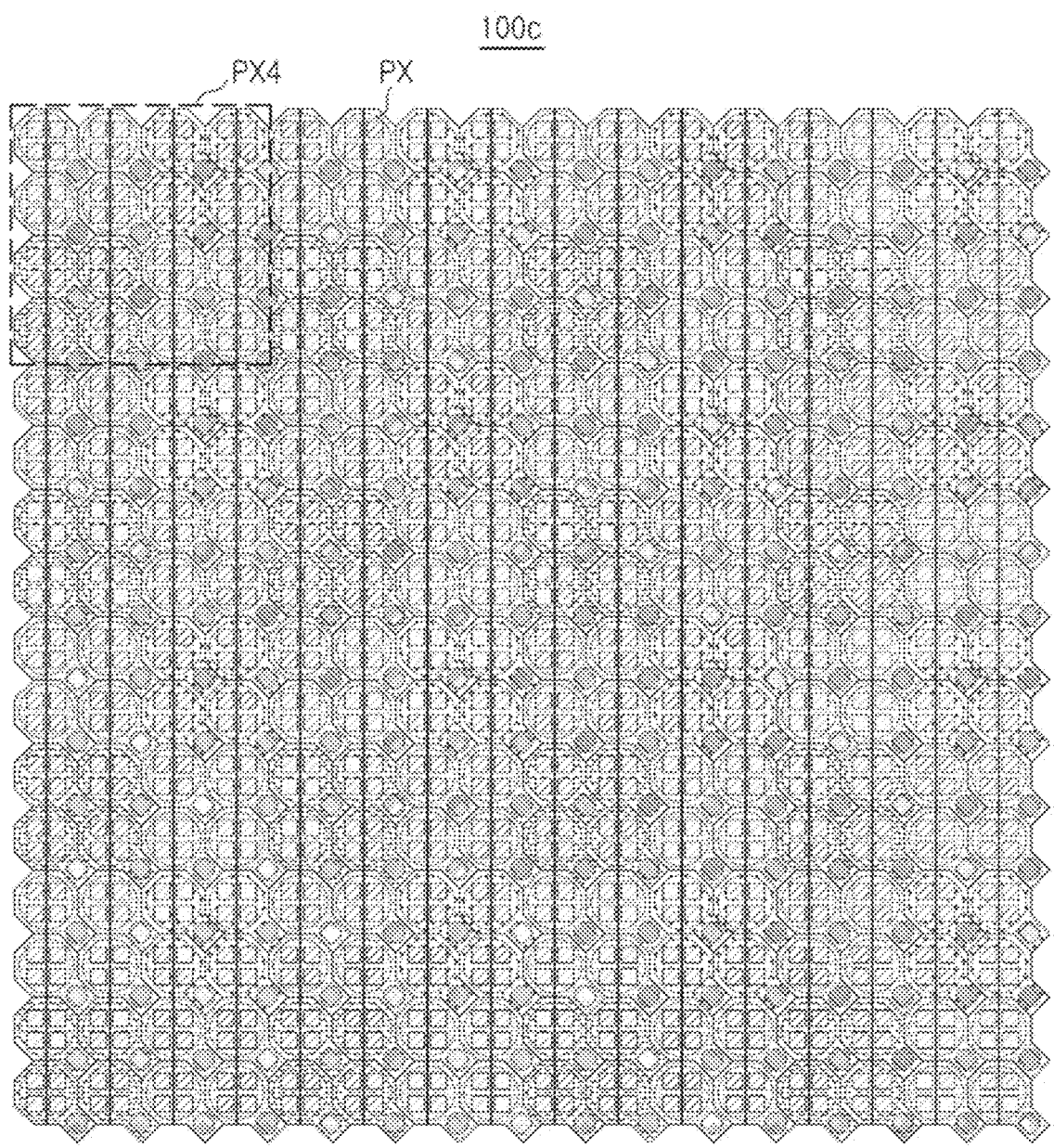
Figure 8:
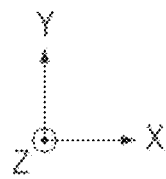
Figure 8:
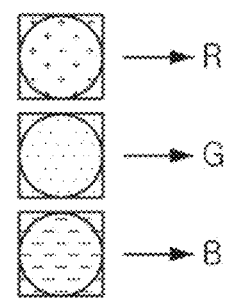

FIGS. 6, 7 and 8 are plan views schematically illustrating a pixel array included in an image sensor according to embodiments.

First, referring to FIG. 6, a pixel array 100a of an image sensor according to embodiments may include a plurality of pixels PX1 and PX2. For example, the pixel array 100a may include a normal pixel PX1 and an auto focus pixel PX2. Each of the normal pixel PX1 and the auto focus pixel PX2 may be plural, and the number thereof may be variously modified. For example, the number of normal pixels PX1 may be greater than the number of the auto focus pixels PX2. Also, the position of the auto focus pixel PX2 is not limited to the illustration in FIG. 6 and may be variously modified.

In the pixel array 100a of the image sensor according to the example embodiment, each of the plurality of pixels PX1 and PX2 may include a plurality of first photodiodes and a second photodiode. On the other hand, some of the plurality of first photodiodes included in the auto-focus pixel PX2 may be third photodiodes for performing an auto-focusing function. For example, in the auto-focus pixel PX2, at least some of the remaining ones of the plurality of first photodiodes and the third photodiodes may share one first microlens. According to embodiments, the arrangement directions of the plurality of first photodiodes and the third photodiodes included in the autofocus pixel PX2 may be different. The pixel array 100a may include red (R) pixels, green (G) pixels, and blue (B) pixels.

Referring to FIG. 7, a pixel array 100b may include a plurality of pixels PX3, and each of the plurality of pixels PX3 may include a plurality of first photodiodes, a second photodiode, and a third photodiode. According to the example embodiment illustrated in FIG. 7, each of the plurality of pixels PX3 included in the pixel array 100b may be an auto focus pixel. Similar to the description with reference to FIG. 6, in at least some of the plurality of pixels PX3, the plurality of first photodiodes and the third photodiodes may be arranged in different directions. On the other hand, only a portion of the plurality of pixels PX3 may also be used for the autofocusing function.

Next, referring to FIG. 8, a pixel array 100c may include a plurality of pixel groups PX4, and each of the plurality of pixel groups PX4 may include a plurality of unit pixels PX. The a plurality of unit pixels PX included in each of the pixel groups PX4 may include a plurality of color filters of the same color. In the example embodiment illustrated in FIG. 8, each of the unit pixels PX may include a plurality of first photodiodes, a second photodiode, and a third photodiode. However, according to embodiments, only some of the unit pixels PX may include a plurality of first photodiodes, a second photodiode, and a third photodiode, or the arrangement directions of the plurality of first photodiodes and the third photodiodes may be different in at least some of the unit pixels PX.

In the embodiments described with reference to FIGS. 6 to 8, an intra-pixel isolation layer may be disposed between the plurality of first photodiodes and the third photodiode. For example, a light-receiving area of each of the plurality of first photodiodes and the third photodiode may be determined by the intra-pixel isolation layer. If the intra-pixel isolation layer is not correctly aligned between the plurality of first photodiodes and the third photodiode, a difference may occur between the light-receiving area of the first photodiode and the light-receiving area of the third photodiode, and the autofocusing function of the image sensor may be deteriorated.

In embodiments, the above problem may be prevented by forming an intra-pixel isolation layer together with a pixel isolation layer separating the pixels from each other. For example, a trench for forming the pixel isolation layer and a trench for forming the intra-pixel isolation layer may be formed simultaneously by a single process. Accordingly, the intra-pixel isolation layer may be accurately aligned, and the difference in the light-receiving area of the first photodiode and the third photodiode may be significantly reduced, thereby preventing deterioration of the autofocusing function of the image sensor.

For example, the pixel isolation layer and the intra-pixel isolation layer may be collectively referred to as a device isolation layer. In accordance with embodiments, a description of a device isolation layer formed inside and outside of a pixel will be described later.

Figure 9:
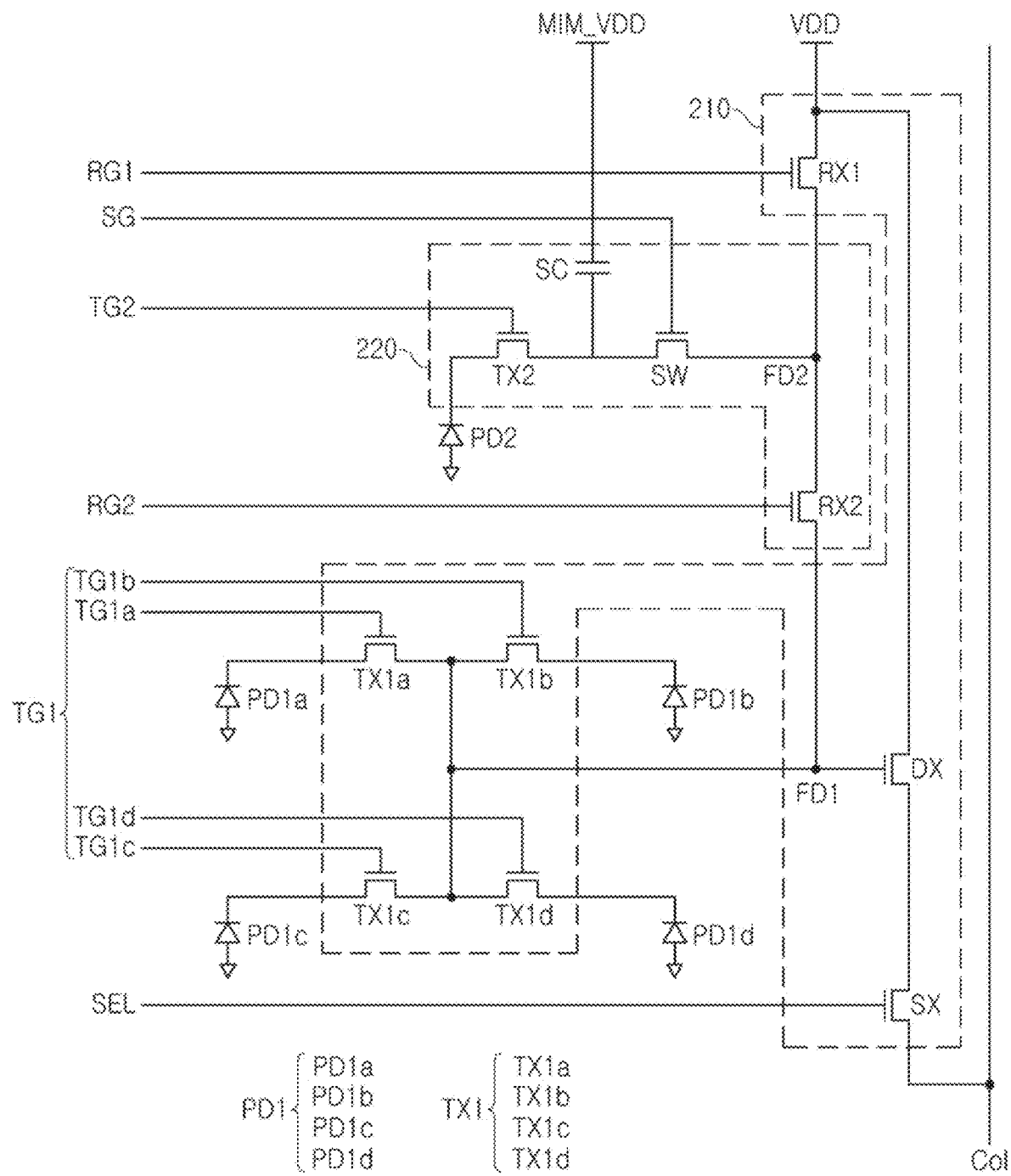
FIG. 9 is a circuit diagram illustrating a pixel circuit of an image sensor according to embodiments.

FIG. 9 is a circuit diagram illustrating a pixel circuit of an image sensor according to embodiments.

Referring to FIG. 9, a pixel circuit 200 of an image sensor according to embodiments may include a first pixel circuit 210 and a second pixel circuit 220. The first pixel circuit 210 may output an electric signal using electric charges generated by a plurality of first photodiodes PD1a, PD1b, PD1c and PD1d (PD1), and the second pixel circuit 220 may output an electric signal, using the electric charge generated by the second photodiode PD2. Operations of active elements included in each of the first and second pixel circuits 210 and 220 may be controlled by a controller included in the image sensor.

The first pixel circuit 210 may include a first reset transistor RX1, a plurality of first transfer transistors TX1a, TX1b, TX1c and TX1d (TX1), a driving transistor DX, a selection transistor SX, and the like. The plurality of first photodiodes PD1 may be respectively connected to a first floating diffusion region FD1 through the plurality of first transfer transistors TX1. For example, the plurality of first photodiodes PD1 may share the first floating diffusion region FD1.

The plurality of first transfer transistors TX1 may respectively transmit electric charges accumulated in the plurality of respective first photodiodes PD1, based on a plurality of first transmission control signals TG1a, TG1b, TG1c and TG1d (TG1) transmitted from the row driver, to the first floating diffusion region FD1. The plurality of first photodiodes PD1 may generate electrons as main electric charge carriers. The driving transistor DX may operate as a source follower buffer amplifier by electric charges accumulated in the first floating diffusion region FD1. The driving transistor DX may amplify an electrical signal corresponding the electric charges accumulated in the first floating diffusion region FD1 and may transfer the electrical signal to the selection transistor SX.

The selection transistor SX may operate by a selection control signal SEL input from the row driver, and may perform switching and addressing operations. When the selection control signal SEL is applied from the row driver, a voltage may be output to a column line Col connected to the selection transistor SX. The voltage may be detected by a readout circuit and a column driver connected to the column line Col. The column driver and readout circuit may detect the reset voltage in a state in which electric charges are not accumulated in the first floating diffusion region FD1, and may detect the pixel voltage in a state in which electric charges are accumulated in the first floating diffusion region FD1. In embodiments, the image sensor may generate an image by calculating a difference between the reset voltage and the pixel voltage.

On the other hand, the second pixel circuit 220 may include a second reset transistor RX2, a second transfer transistor TX2, a switching element SW, and a storage capacitor SC. The second photodiode PD2 may be connected to the switching element SW and the storage capacitor SC through the second transfer transistor TX2. Similar to the plurality of first photodiodes PD1, the second photodiode PD2 may also generate electrons as main electric charge carriers. Electric charge generated by the second photodiode PD2 may move to the storage capacitor SC when the second transfer transistor TX2 is turned on. The first reset transistor RX1 may be turned on/off by a first reset control signal RG1, the second reset transistor RX2 may be turned on/off by a second reset control signal RG2, the second transfer transistor TX2 may be turned on/off by a second transmission control signal TG2, and the switching element SW may be turned on/off by a switching control signal SG.

The storage capacitor SC may be a device for storing electric charges generated by the second photodiode PD2. The storage capacitor SC may be implemented as a Metal-Insulator-Metal (MIM) capacitor, an active capacitor or the like. On the other hand, a second power supply voltage MIM_VDD connected to the storage capacitor SC may be a value less than a first power supply voltage VDD of the entire pixel circuit, which is only embodiments and is not limited thereto, and the first power supply voltage VDD and the second power supply voltage MIM_VDD may be the same.

The storage capacitor SC may store electric charges in response to an amount of electric charge generated by the second photodiode PD2 and an operation of the second transfer transistor TX2. The switching element SW is connected between the storage capacitor SC and a second floating diffusion region FD2, and electric charges of the storage capacitor SC may move to the second floating diffusion region FD2 by an on/off operation of the switching element SW.

On the other hand, the second reset transistor RX2 may be connected between the second floating diffusion region FD2 and the first floating diffusion region FD1. For example, the second floating diffusion region FD2 may be connected to the first reset transistor RX1, the second reset transistor RX2, and the second transfer transistor TX2. Electric charges accumulated in the second floating diffusion region FD2 may move to the first floating diffusion region FD1 in response to an operation of the second reset transistor RX2.

In the operation of the pixel circuit 200, the first pixel circuit 210 and the second pixel circuit 220 may share at least some circuit elements. As an example, the second pixel circuit 220 may use the driving transistor DX and the selection transistor SX to output a pixel voltage corresponding to the electric charge generated by the second photodiode PD2. In addition, the first pixel circuit 210 may use the second reset transistor RX2 and the second floating diffusion region FD2 to adjust a conversion gain of electric charges generated by the plurality of first photodiodes PD1 or the capacity of the pixel.

In the example embodiment illustrated in FIG. 9, the plurality of first photodiodes PD1 and the second photodiode PD2 may share the column line Col. Accordingly, while the first pixel voltage corresponding to the electric charges of the plurality of first photodiodes PD1 is output to the column line Col, the second photodiode PD2 may be separated from the column line Col. For example, while the first pixel voltage is output to the column line Col, the second photodiode PD2 may be separated from the column line Col by turning off either one or both of the second reset transistor RX2 and the switching element SW. To generate a first pixel voltage by using the electric charges of the plurality of first photodiodes PD1 and output the generated first pixel voltage to the column line Col, the first transfer transistor TX1 is turned on such that electric charges generated by the first photodiodes PD1 may be accumulated in the first floating diffusion region FD1.

Similarly, while the second pixel voltage corresponding to the electric charge of the second photodiode PD2 is output to the column line Col, the plurality of first photodiodes PD1 may be separated from the column line Col. For example, while the second pixel voltage is output to the column line Col, the first transfer transistor TX1 is turned off to separate the plurality of first photodiodes PD1 from the column line Col. To generate the second pixel voltage and output the generated second pixel voltage to the column line Col, the switching element SW and the second reset transistor RX2 are turned on, such that the first floating diffusion region FD1 and the second floating diffusion region FD2 may be connected to each other. Electric charges generated by the second photodiode PD2 and stored in the storage capacitor SC may be accumulated in the first floating diffusion region FD1 and the second floating diffusion region FD2, to be converted to a voltage by the driving transistor DX.

In embodiments, the second photodiode PD2 may be used for detecting an external light source in which a flicker phenomenon occurs, or for improving a dynamic range of an image sensor. To improve the dynamic range of the image sensor, when the first pixel voltage generated by the electric charges of the plurality of first photodiodes PD1 is output a plurality of times, a second pixel voltage generated by the electric charges of the second photodiode PD2 may be output only once.

The sum of the areas of the plurality of first photodiodes PD1 may be larger than the area of the second photodiode PD2. In embodiments, an image accurately representing an external light source in which flicker occurs may be generated, using the electric charge generated by the second photodiode PD2, while the electric charges generated by the plurality of first photodiodes PD1 may be used to generate a normal image. In addition, by adjusting the exposure time period for each of the first photodiode PD1 and the second photodiode PD2 to receive light, the dynamic range and image quality of the image sensor may be improved. The timing of control signals for describing the operation of the image sensor will be described later.

FIGS. 10, 11, 12 and 13 are schematic diagrams illustrating pixels included in an image sensor according to embodiments.

Figure 10:
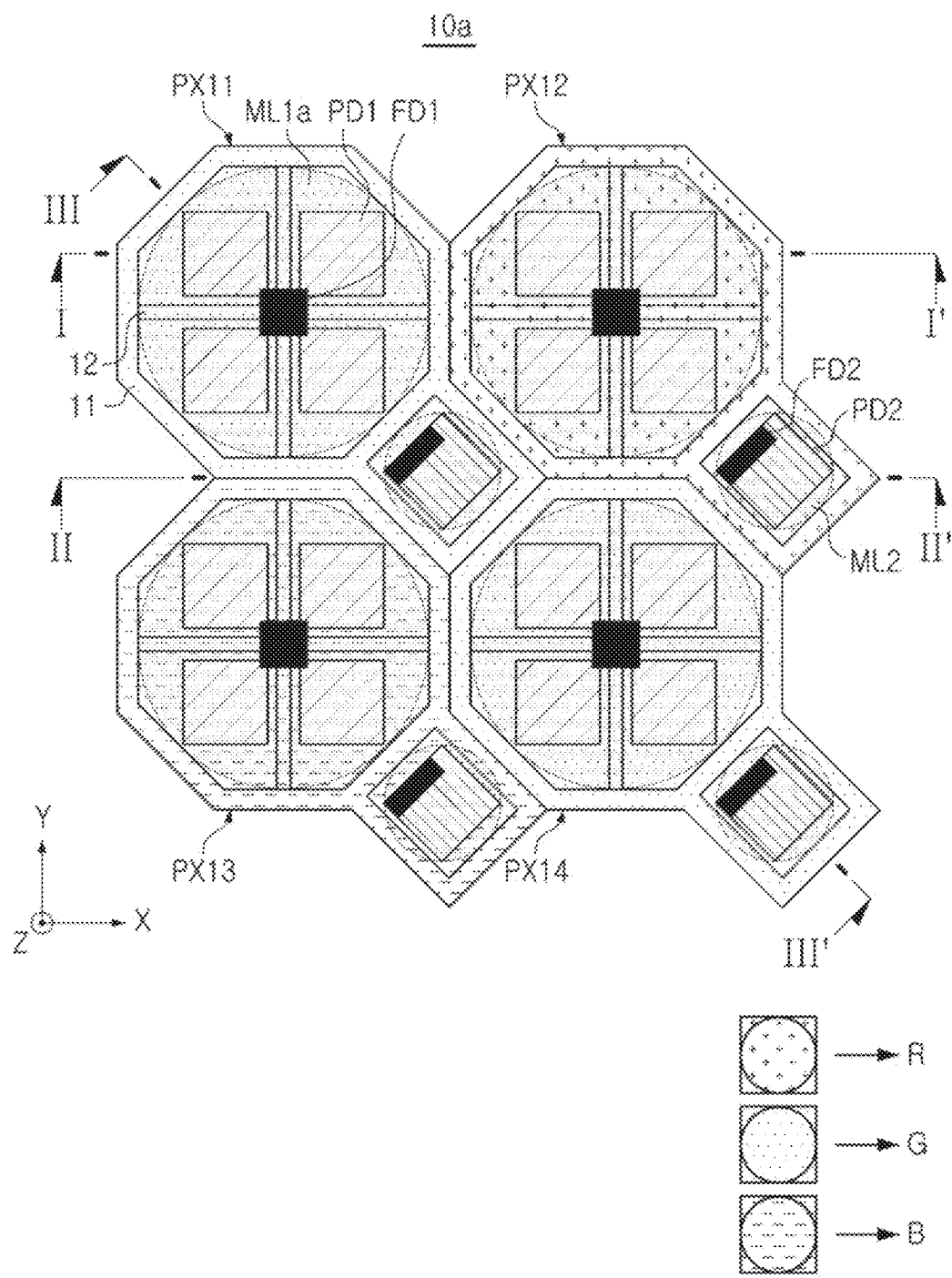
FIGS. 10, 11, 12 and 13 are schematic diagrams illustrating pixels included in an image sensor according to embodiments.
Figure 10:
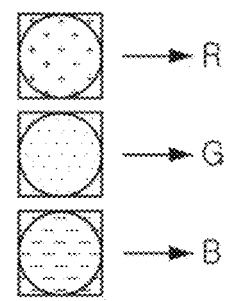

First, a pixel array 10a illustrated in FIG. 10 may correspond to the pixel array 10a illustrated in FIG. 5A. For example, the pixel array 10a may include a plurality of pixels PX11-PX14.

Referring to FIG. 10, a pixel isolation layer 11 is disposed between the pixels PX11-PX14, and each of the pixels PX11-PX14 may include an intra-pixel isolation layer 12. For example, the intra-pixel isolation layer 12 may be disposed between the plurality of first photodiodes PD1. On the other hand, the plurality of first photodiodes PD1 and the second photodiode PD2 are included in one pixel, but an isolation layer similar to the pixel isolation layer 11 may be positioned therebetween. For example, the pixel isolation layer 11 and the intra-pixel isolation layer 12 may be collectively referred to as a device isolation layer DTI. The pixel isolation layer 11 and the intra-pixel isolation layer 12 may extend in the vertical direction (Z direction) within a substrate including a semiconductor material.

Figure 11:
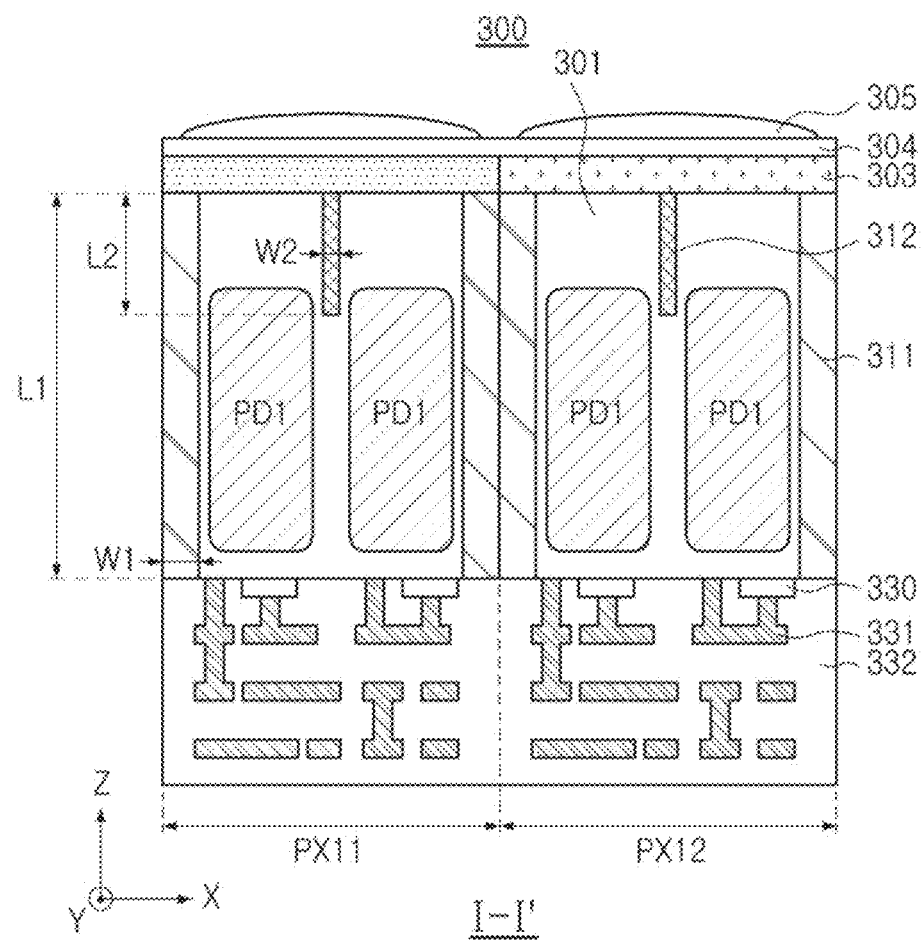
Figure 12:
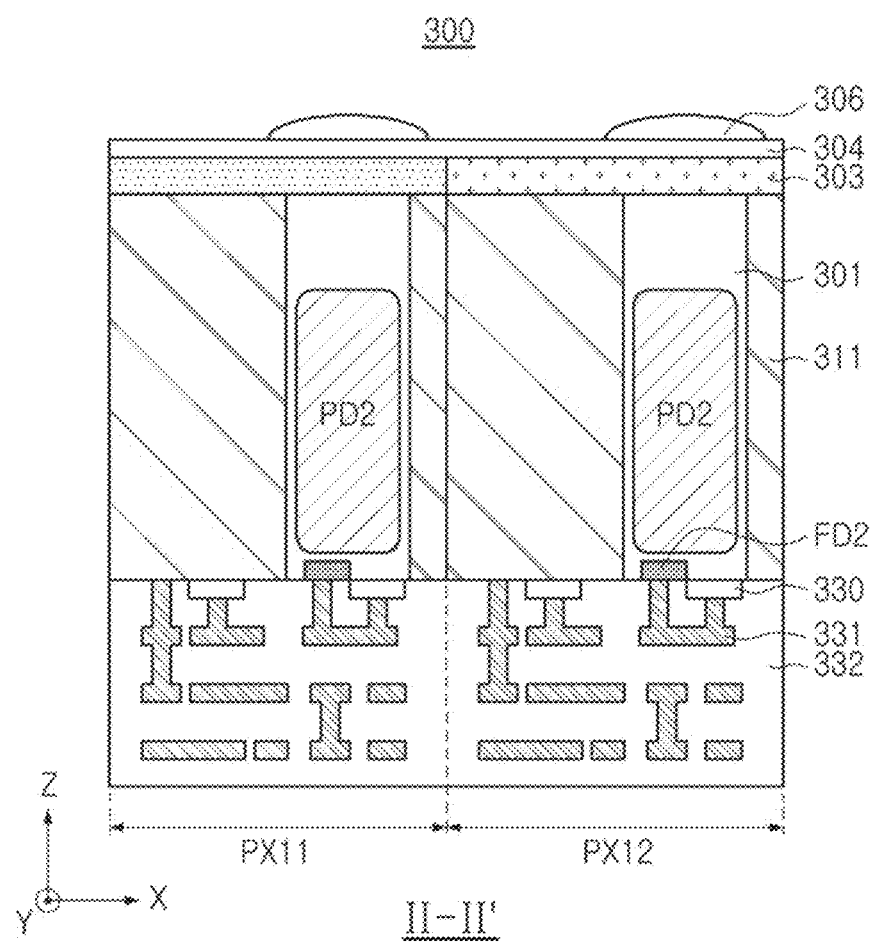
Figure 13:
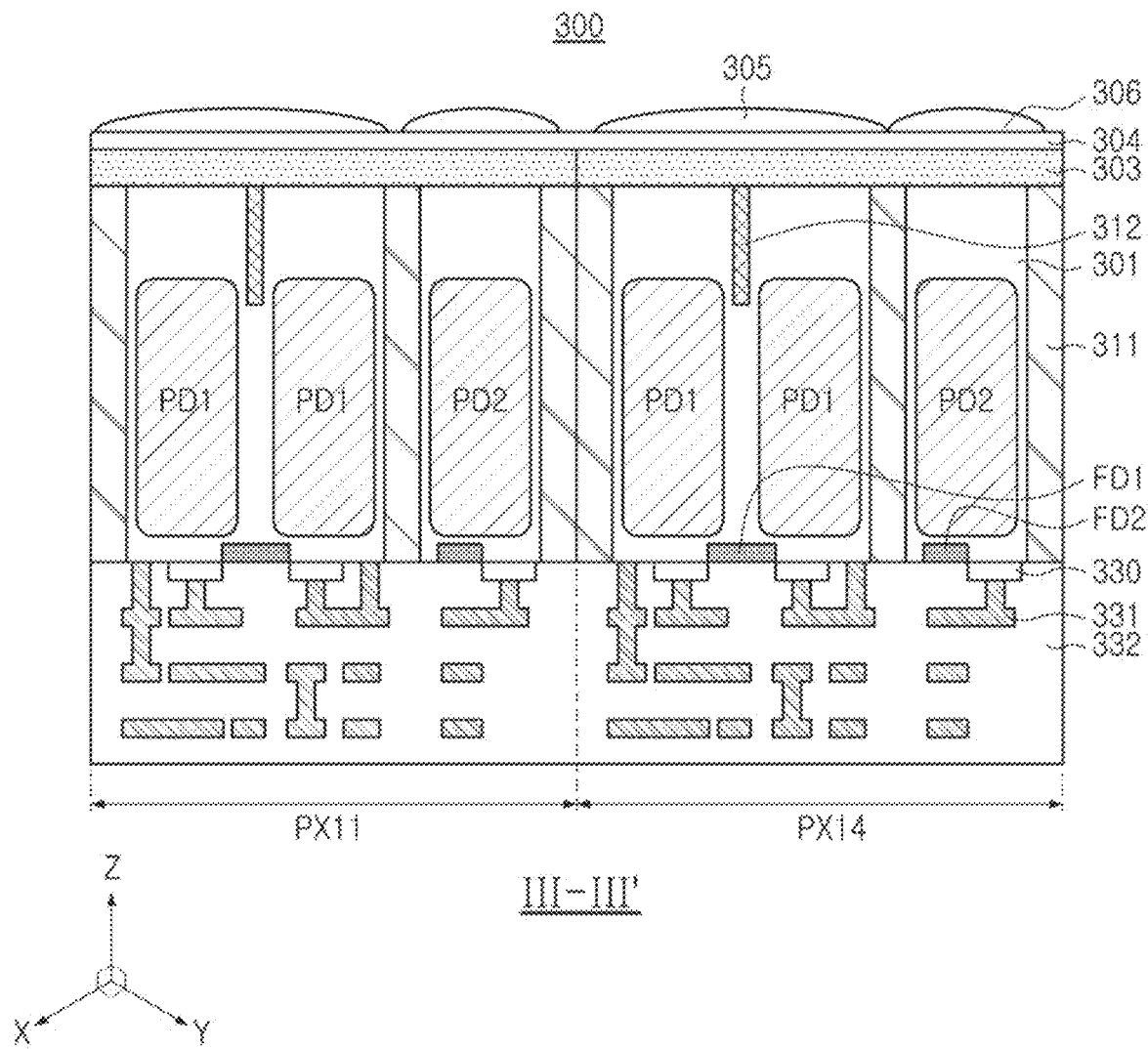

On the other hand, FIG. 11 may be a cross-sectional view illustrating a cross-section in the direction I-I' of FIG. 10, and FIGS. 12 and 13 may be cross-sectional views illustrating cross-sections in the directions II-II' and III-III' of FIG. 10, respectively.

Referring to FIGS. 11 to 13, in an image sensor 300 according to embodiments, a pixel circuit may be disposed below a plurality of first photodiodes PD1 and a second photodiode PD2. As an example, the pixel circuit may include a plurality of elements 330, wiring patterns 331 connected to the plurality of elements 330, an insulating layer 332 covering the plurality of elements 330 and the wiring patterns 331, and the like, and may be disposed on a first surface of a substrate 301.

The pixel circuit may include floating diffusion regions FD1 and FD2. As an example, each of the pixels PX11-PX14 includes a first floating diffusion region FD1 and a second floating diffusion region FD2, and the first floating diffusion region FD1 may be disposed below the plurality of first photodiodes PD1, and the second floating diffusion region FD2 may be disposed below the second photodiode PD2. The first floating diffusion region FD1 and the second floating diffusion region FD2 may be electrically connected to each other by any one or any combination of the wiring patterns 331, and the location and capacity of the first floating diffusion region FD1 and the second floating diffusion region FD2 may be variously modified depending on embodiments.

The first floating diffusion region FD1 may be disposed near an intra-pixel isolation layer 312, and the second floating diffusion region FD2 may be disposed near a pixel isolation layer 311. On the other hand, elements 330 adjacent to the first floating diffusion region FD1 and the second floating diffusion region FD2 may be a plurality of first transfer transistors and a second transfer transistor. Respective gates of the plurality of first transfer transistors and the second transfer transistor may have a vertical structure in which at least partial region thereof is buried in the substrate 301, and electric charges generated by the photodiodes may also be transmitted to the floating diffusion regions through the transfer transistors.

Each of the pixels PX11-PX14 may include a color filter 303 and a light transmitting layer 304, which are disposed on a second surface of the substrate 301, and microlenses 305 and 306. In each of the pixels, the color filter 303 may be disposed above and shared by the plurality of first photodiodes PD1 and the second photodiode PD2. As an example, each of the pixels PX11 to PX14 includes a first microlens 305 disposed above the plurality of first photodiodes PD1 and a second microlens 306 disposed above the second photodiode PD2. Light passing through the respective microlenses 305 and 306 may enter the photodiodes PD1 and PD2 disposed below the microlenses 305 and 306. On the other hand, the first microlens 305 and the second microlens 306 may not be the same depending on embodiments. As an example, the diameters, areas, and/or thicknesses of the first microlens 305 and the second microlens 306 are not limited to those illustrated in the drawings and may be different from each other.

Referring to FIG. 11, the pixel isolation layer 311 may have a first width W1 and a first length L1, and the intra-pixel isolation layer 312 may have a second width W2 and a second length L2. For example, the second width W2 of the intra-pixel isolation layer 312 may be less than the first width W1. The pixel isolation layer 311 and the intra-pixel isolation layer 312 may be formed simultaneously in a single process. However, the embodiments are not limited thereto, and the first width W1 and the second width W2 may also be the same depending on embodiments. For example, the first width W1 may have a value between about 110 nm and 130 nm, but this is only embodiments and is not limited thereto, and the first width W1 may be 130 nm or more or 110 nm or less.

In addition, the first length L1 may be greater than the second length L2. For example, the first length L1 may be about 1.1 um to 1.3 um, and the second length L2 may be about 0.2 um to 0.4 um, which is only embodiments and is not limited thereto, and the first length L1 and the second length L2 may each have various values. On the other hand, the pixel isolation layer 311 may completely penetrate through the substrate 301 and may extend from the first surface to the second surface of the substrate 301.

In the image sensor 300 according to embodiments, the intra-pixel isolation layer 312 may have a length less than that of the plurality of first photodiodes PD1 in the vertical direction (Z direction). Accordingly, electric charges may move between the plurality of first photodiodes PD1 with the intra-pixel isolation layer 312 interposed therebetween. For example, when an excessive amount of electric charge is generated in any one of the plurality of first photodiodes PD1, the electric charge may move, thereby preventing saturation of the first photodiode PD1.

In embodiments, the pixel isolation layer 311 and the intra-pixel isolation layer 312 may be formed in the same process, and the pixel isolation layer 311 and the intra-pixel isolation layer 312 may extend from the second surface of the substrate 301 on which the microlenses 305 and 306 are disposed. By forming the pixel isolation layer 311 and the intra-pixel isolation layer 312 in the same process, the position of the intra-pixel isolation layer 312 within the respective pixels PX11-PX14 may be accurately aligned, which is only embodiments. For example, the pixel isolation layer 311 and/or the intra-pixel isolation layer 312 may also extend from the first surface of the substrate 301 on which the pixel circuit is disposed. Accordingly, the shape of a cross section of the image sensor 300 may vary depending on embodiments.

FIGS. 14, 15, 16, 17 and 18 are schematic diagrams illustrating pixels included in an image sensor according to embodiments.

Figure 14:
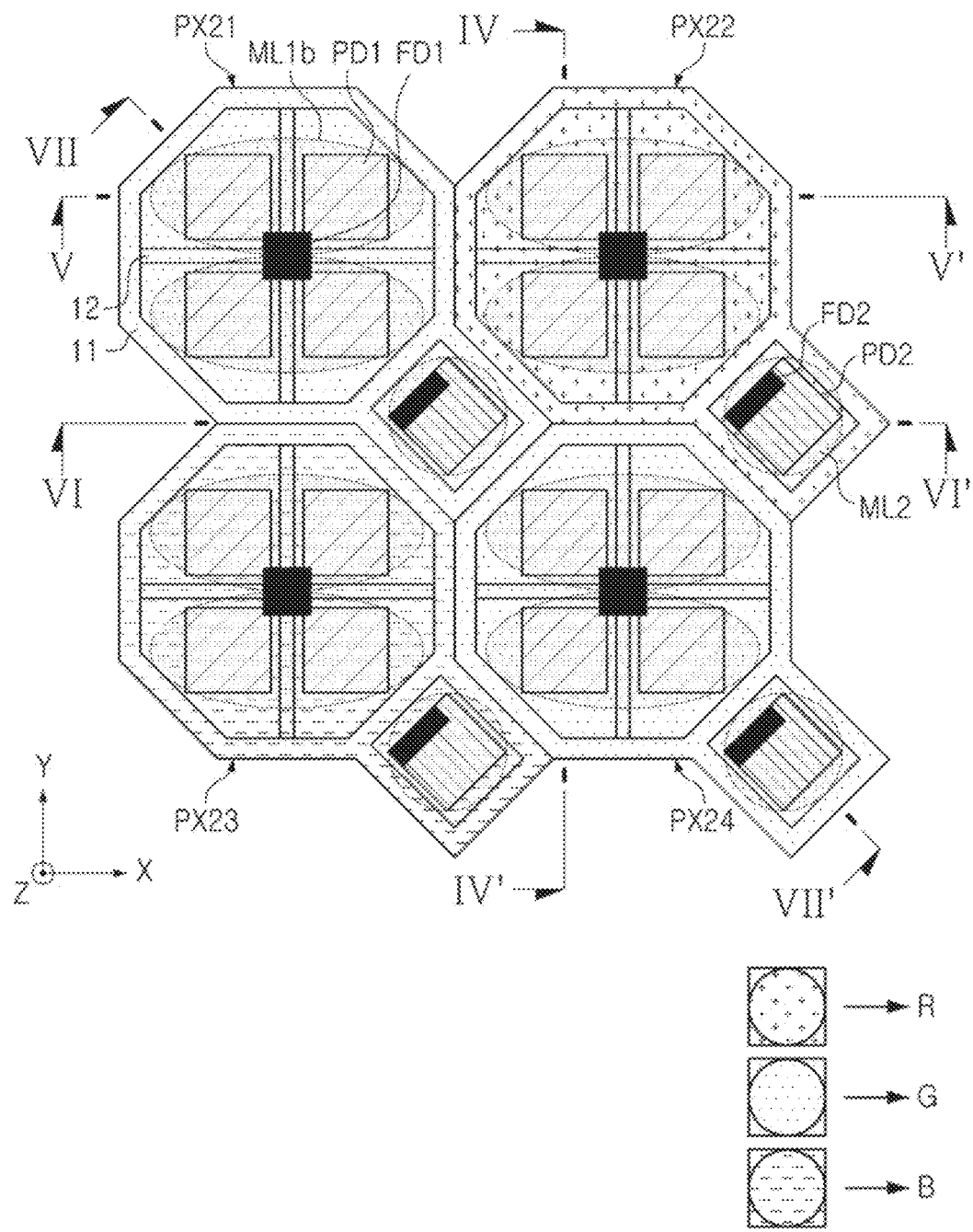
FIGS. 14, 15, 16, 17 and 18 are schematic diagrams illustrating pixels included in an image sensor according to embodiments.
Figure 15:
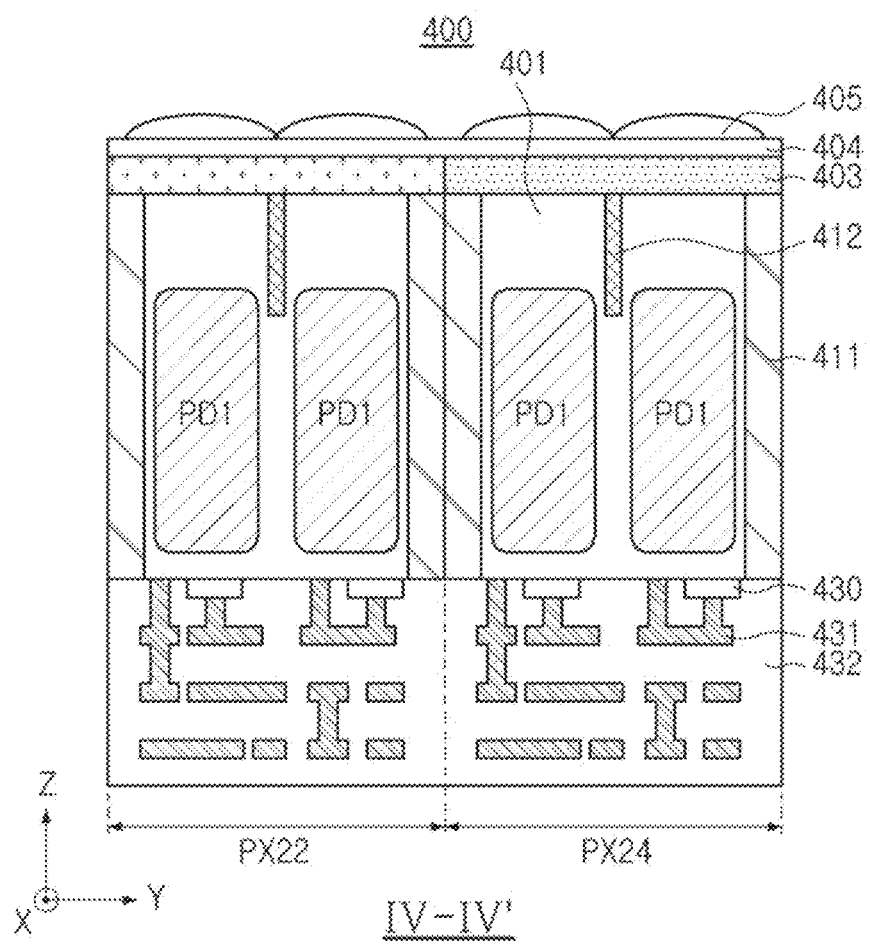
Figure 16:
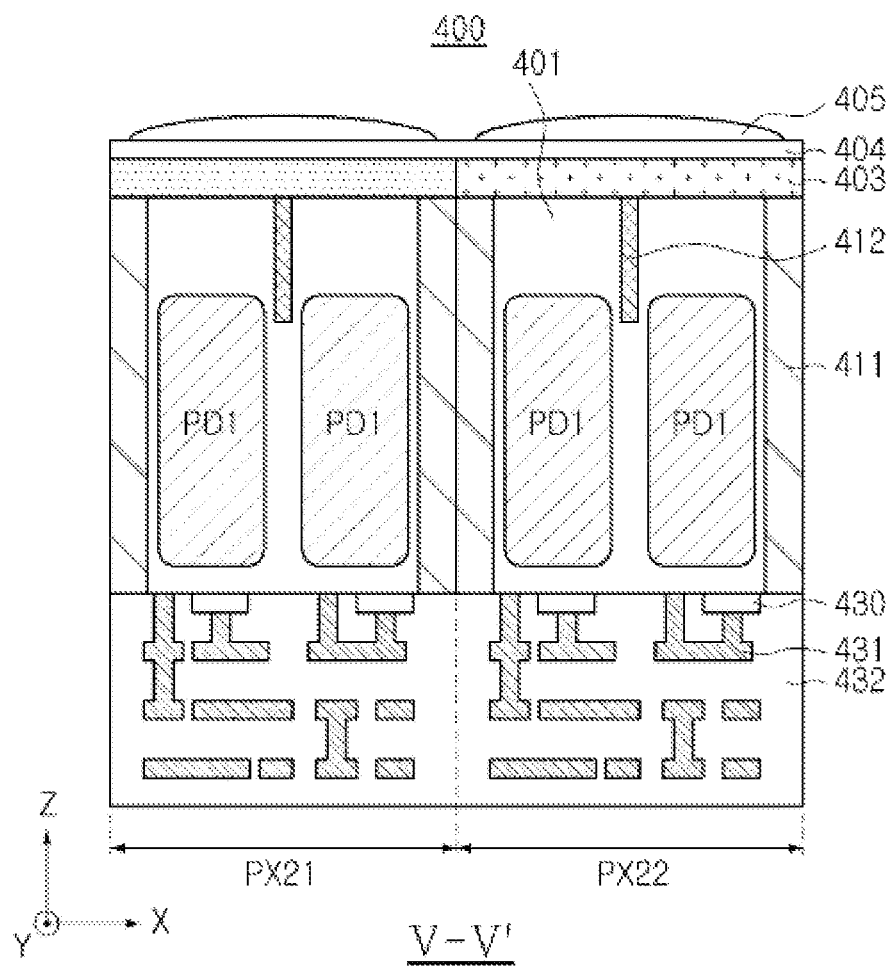
Figure 17:
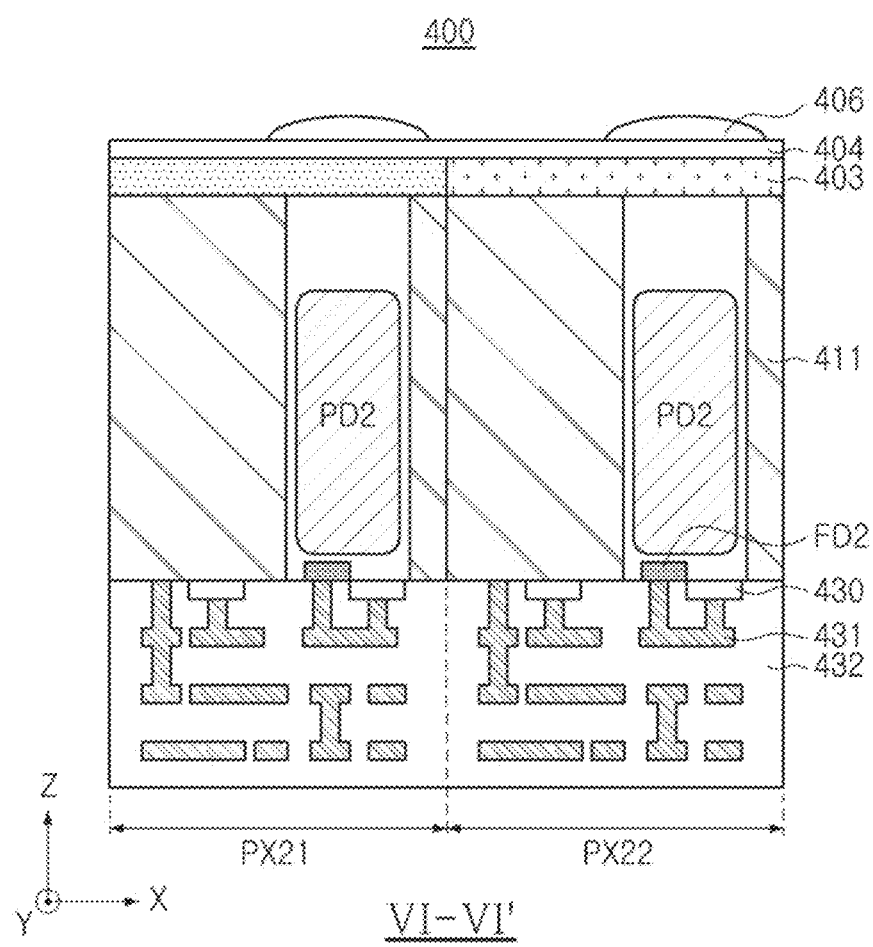
Figure 18:
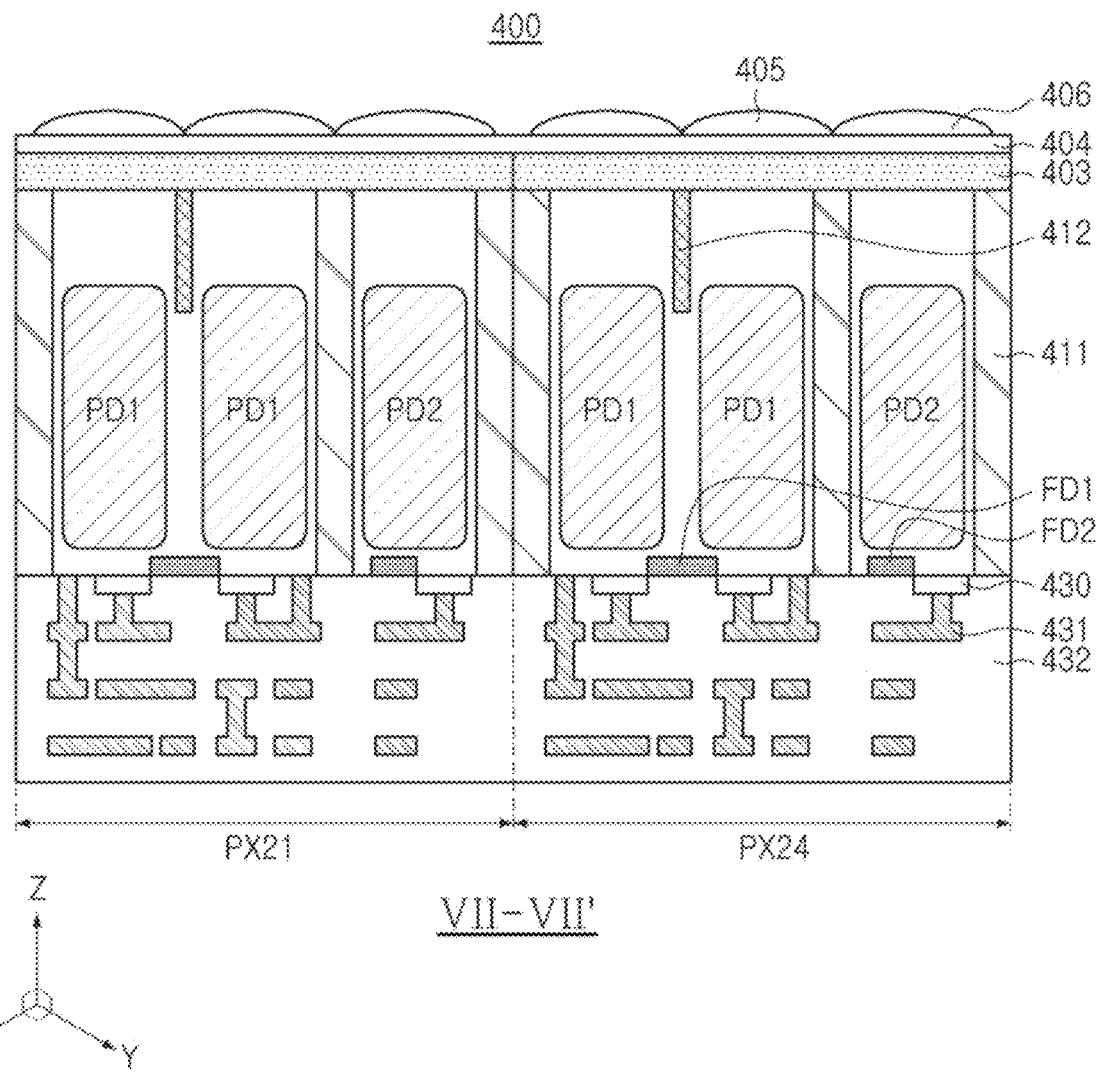

Referring to FIG. 14, unlike the pixel array 10a illustrated in FIG. 10, in the case of a pixel array 10b included in an image sensor according to embodiments, two first microlenses ML1b may be disposed above a plurality of first photodiodes PD1 in each pixel. For example, the pixel arrays 10b illustrated in FIGS. 14 and 5B may correspond to each other, and the pixel array 10b may include a plurality of pixels PX21-PX24.

On the other hand, FIGS. 15 to 18 may be cross-sectional views illustrating cross sections in directions IV-IV' to VII-VII' of FIG. 13, respectively. Referring to FIGS. 15 to 18, in an image sensor 400 according to embodiments, a pixel circuit may be disposed below a plurality of first photodiodes PD1 and a second photodiode PD2. For example, the pixel circuit may be disposed on a first surface of a substrate 401 and may include a plurality of elements 430, wiring patterns 431, insulating layers 432, and the like.

The image sensor 400 illustrated in FIGS. 15 to 18 may correspond to the image sensor 300 illustrated in FIGS. 11 to 13, and may include a color filter 403, a light transmitting layer 404, microlenses 405 and 406, a pixel isolation layer 411 and an intra-pixel isolation layer 412. However, because each of the pixels PX21-PX24 included in the image sensor 400 has two first microlenses 405, there may be a difference between the image sensor 400 and the image sensor 300 that has one first microlens 305 in each pixel, in terms of cross-sectional views thereof.

On the other hand, in a case in which the number of the first microlenses 405 varies, not only the area but also the thickness may vary, and the shape, area and thickness of the first microlenses 405 are not limited to the illustration in FIGS. 15 to 18.

Figure 19:
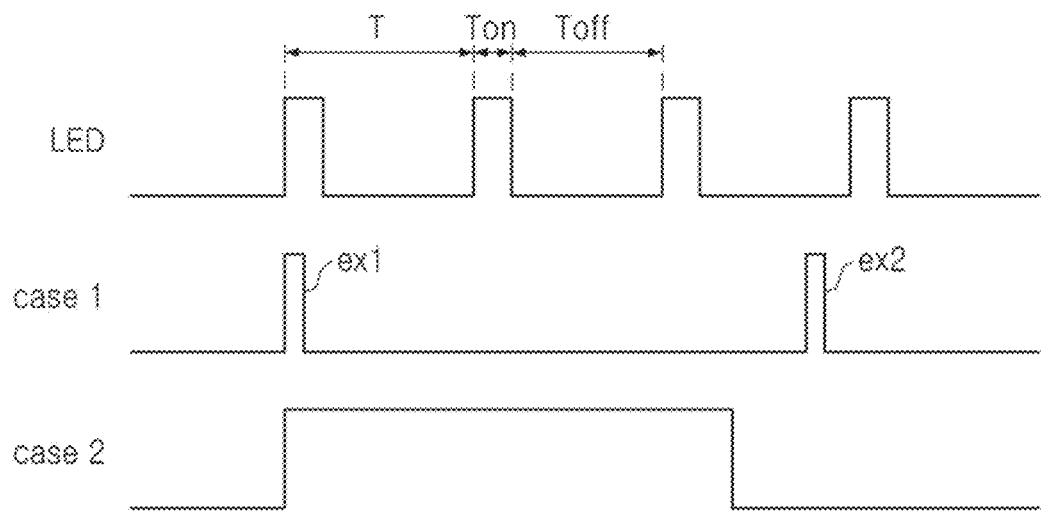
FIGS. 19 and 20 are diagrams illustrating an operation of an image sensor according to embodiments.
Figure 20:
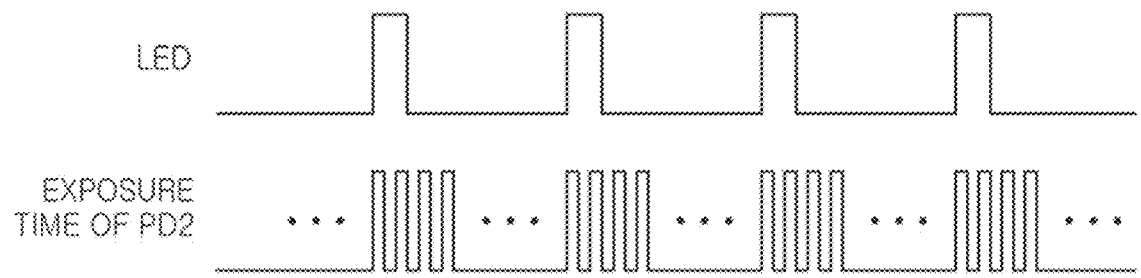

FIGS. 19 and 20 are diagrams illustrating an operation of an image sensor according to embodiments.

FIG. 19 may be a diagram illustrating an operation of an image sensor. In embodiments, an LED may operate in a pulse-width-modulation (PWM) method. Accordingly, as illustrated in FIG. 19, the LED may operate according to a period T having a turn-on time (Ton) and a turn-off time (Toff).

First, referring to a first case (case1) of FIG. 19, whether the image sensor detects the LED may be determined according to whether the exposure time period of the photodiode included in the image sensor to the light overlaps with the turn-on time (Ton) of the LED. For example, the first case (case1) may correspond to a case in which the illuminance of the environment to be captured by the image sensor is relatively high, and thus the exposure time period of the photodiode may be set to be relatively short. In the first case (case1), a first exposure time period (ex1) may overlap with the turn-on time (Ton) of the LED, and the light of the LED may be accurately detected, using the electric charge generated by the photodiode during the first exposure time period (ex1).

In the first case (case1), a second exposure time period ex2 may not overlap with the turn-on time Ton of the LED. In the PWM method of driving the LED, a duty ratio indicating the ratio of the turn-on time (Ton) to the entire period (T) may not be 100%. Therefore, in the first case (case1) in which the exposure time periods (ex1, ex2) are set to be relatively short due to high illuminance, a case in which the exposure time period of the photodiode is deviated from the turn-on time (Ton) of the LED like the second exposure time period (ex2) may occur. Therefore, with an image using the electric charge generated by the photodiode during the second exposure time period (ex2), the light of the LED may not be accurately detected.

Next, the second case (case2) of FIG. 19 may correspond to a case in which the illuminance of the environment to be captured by the image sensor is relatively low. Therefore, as illustrated in FIG. 19, the exposure time period of the photodiode may be selected very long. In the second case (case2), as the photodiode is exposed for a long time, the photodiode may be easily saturated, and as a result, light from the LED may not be accurately detected.

FIG. 20 may be a diagram for describing an operation of an image sensor according to embodiments. As described above, the image sensor according to embodiments includes a plurality of pixels, and each of the plurality of pixels may include a plurality of first photodiodes and a second photodiode. The second photodiode has a relatively small area compared to the plurality of first photodiodes, and may be used for detecting a light source in which a flicker phenomenon occurs, such as in an LED. On the other hand, as in the example embodiment illustrated in FIG. 19, the LED may operate in a pulse-width-modulation method, and may have the turn-on time (Ton) and the turn-off time (Toff) within one period (T).

Referring to FIG. 20, the exposure time period of the second photodiode PD2 may be shorter than the turn-on time (Ton) of the LED. The second photodiode PD2 may be exposed to light a plurality of times to generate electric charge, and the electric charge generated by the second photodiode PD2 may accumulate in the floating diffusion region each time the exposure time period ends. Accordingly, saturation of the second photodiode PD2 may be prevented irrespective of the illuminance of the external environment to be captured by the image sensor. In addition, by exposing the second photodiode (PD2) to light for a plurality of short exposure time periods, the turn-on time (Ton) of the LED and the exposure time period of the second photodiode PD2 do not deviate from each other, thereby accurately detecting light of LED or the like in which a flicker phenomenon occurs.

Figure 21:
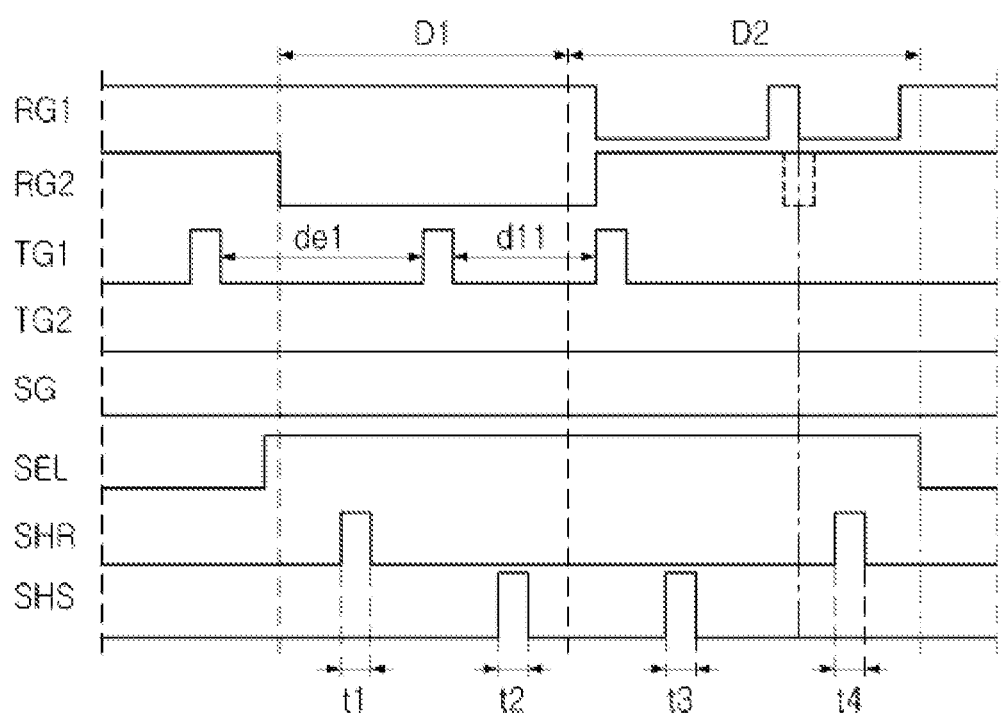
FIGS. 21, 22A and 22B are diagrams provided to illustrate the operation of an image sensor according to embodiments.
Figure 22A:
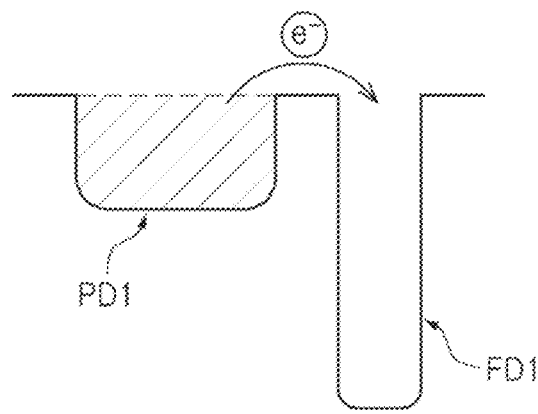
Figure 22B:
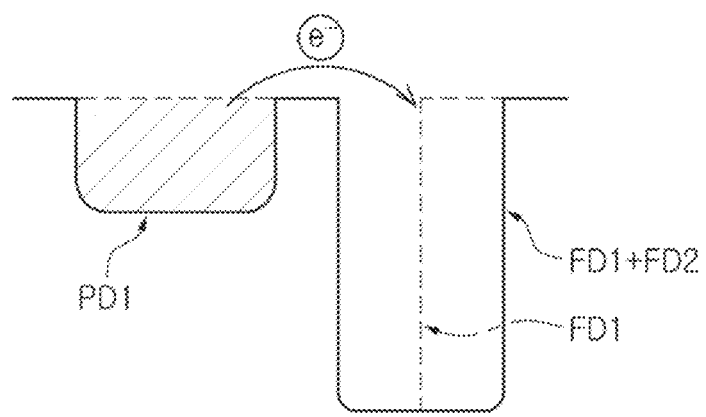

FIGS. 21, 22A and 22B are diagrams provided to illustrate the operation of an image sensor according to embodiments.

FIGS. 21 to 22B are diagrams provided to illustrate the operation of the image sensor according to embodiments. First, FIG. 21 may be a timing diagram for describing an operation of an image sensor having the pixel circuit according to the example embodiment illustrated in FIG. 9. Referring to FIG. 21, the operation of the image sensor according to embodiments may start with an operation in which first and second reset transistors RX1 and RX2 are turned on such that first floating diffusion region FD1 and the second floating diffusion region FD2 are reset. At this time, a first transfer transistor TX1 is turned on together, such that the electric charges of first photodiodes PD1 may be removed.

During a first exposure time period de1 after the first transfer transistor TX1 is turned off, the first photodiode PD1 may be exposed to light. Thereafter, a selection transistor SX may be turned on by a selection control signal SEL to detect a reset voltage and a pixel voltage. When the selection transistor SX is turned on, a first reset voltage and a first pixel voltage may be sequentially detected during a first time period D1. As an example, a sampling circuit of a controller may detect the first reset voltage during a first sampling time t1 when a reset voltage detection signal SHR has a high logic value. In addition, the controller may detect the first pixel voltage during a second sampling time t2 when a pixel voltage detection signal SHS has a high logic value. The first transfer transistor TX1 is turned on and off between the first sampling time t1 and the second sampling time t2, such that electric charge generated by the first photodiode PD1 during the first exposure time period de1 may move to the first floating diffusion region FD1.

In the example embodiment illustrated in FIG. 21, during a second time period D2 after the first time period D1, the image sensor may detect the pixel voltage and the reset voltage from the first photodiode PD1 once more. As illustrated in FIG. 21, when the second time period D2 starts, the first reset transistor RX1 may be turned off and the second reset transistor RX2 may be turned on. Accordingly, the sum of the turn-on capacities of the first floating diffusion region FD1, the second floating diffusion region FD2, and the second reset transistor RX2 may be provided as a floating diffusion region for the first photodiode PD1. As a result, in the second time period D2, electric charges of the first photodiode PD1 may be stored in the floating diffusion region having a larger capacity than in the first time period D1. Accordingly, a conversion gain of the pixel during the second time period D2 may be lower than a conversion gain of the pixel during the first time period D1.

The sampling circuit of the image sensor may detect the second pixel voltage and the second reset voltage at the third sampling time t3 and the fourth sampling time t4, respectively. For example, in the second time period D2, the pixel voltage may be detected before the reset voltage. The second pixel voltage may be a voltage corresponding to electric charges generated by the first photodiode PD1 during the first exposure time period de1 and the second exposure time period de11. The second exposure time period de11 may be shorter than the first exposure time period de1. After the second pixel voltage is detected, the controller turns the first reset transistor RX1 on and off to reset the voltages of the first floating diffusion region FD1 and the second floating diffusion region FD2 and then to detect the second reset voltage. At this time, to compensate for the coupling effect, the second reset transistor RX2 may be turned off during the time that the first reset transistor RX1 is turned on. Referring to FIG. 21, a turn-on time of the first reset transistor RX1, and at least a portion of a turn-off time of the second reset transistor RX2, may overlap each other within the second time period D2.

In the example embodiment illustrated in FIG. 21, image data may be generated using the reset voltage and the pixel voltage detected under different conversion gain conditions. Accordingly, saturation of the first photodiode PD1 and the first floating diffusion region FD1 may be prevented, and an optimized image may be provided to the user regardless of the illuminance of the environment in which the image sensor is operated. The capacity of the first photodiode PD1 may be determined according to a high illuminance condition being easily saturated. In the example embodiment illustrated in FIG. 21, before reading the pixel voltage and the reset voltage in the second time period D2, the second reset transistor RX2 may be turned on to connect the first floating diffusion region FD1 and the second floating diffusion region FD2 to each other, thereby preventing the first floating diffusion region FD1 from being saturated by the electric charge of the first photodiode PD1. Accordingly, the electric charge generated by the first photodiode PD1 may be sufficiently accumulated in the first floating diffusion region FD1 and the second floating diffusion region FD2, and an image may be created using a greater amount of electric charges than the capacity of the first photodiode PD1, and simultaneously, the saturation of the pixel may be prevented. On the other hand, in the operation according to the example embodiment illustrated in FIG. 21, the second photodiode PD2 may not be used.

FIGS. 22A and 22B are diagrams illustrating the operations of the first photodiode PD1 and the floating diffusion region. FIGS. 22A and 22B may be diagrams illustrating a first photodiode PD1 and a floating diffusion region at a first time period D1 having a high conversion gain condition and a second time period D2 having a low conversion gain condition, respectively.

First, referring to FIG. 22A, at a first time period D1, electric charges generated by the first photodiode PD1 may move to the first floating diffusion region FD1. During the first time period D1, because the second reset transistor RX2 is turned off, electric charges may be accumulated only in the first floating diffusion region FD1. The capacity of the first photodiode PD1 may be determined in consideration of the high conversion gain condition as illustrated in FIG. 22A, and thus, the capacity of the first floating diffusion region FD1 and the capacity of the first photodiode PD1 may be similar.

Next, referring to FIG. 22B, at the second time period D2, the second reset transistor RX2 is turned on, not only the first floating diffusion region FD1 and the second floating diffusion region FD2, but also the turn-on capacity of the second reset transistor RX2 may be used as a floating diffusion region. Accordingly, a negative electric charge exceeding the capacity of the first photodiode PD1 may be accumulated in the floating diffusion region and reflected in the pixel voltage through a driving transistor DX. According to the example embodiment described with reference to FIGS. 21 to 22B, image data may be generated using a greater amount of electric charge than the capacity of the first photodiode PD1, and as a result, saturation of the pixel is prevented, and simultaneously, the quality of the data may also be improved.

Figure 23:
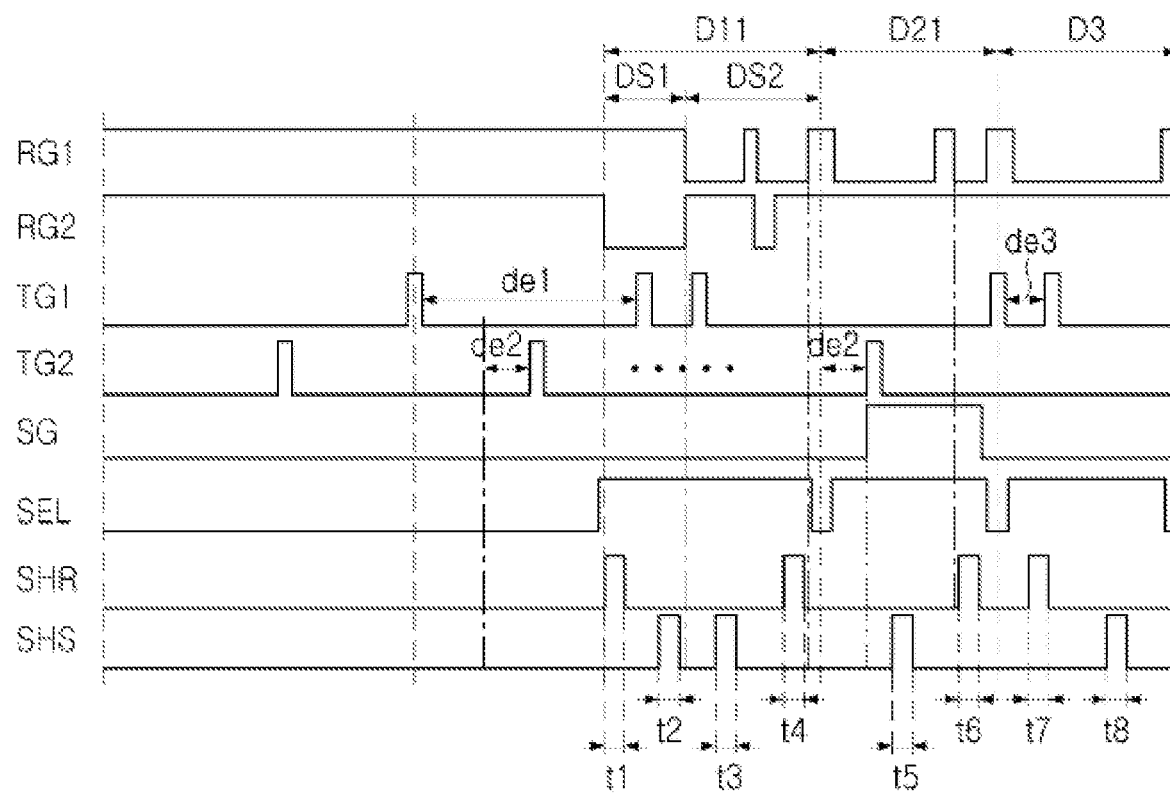
FIG. 23 is a diagram illustrating an operation of an image sensor according to embodiments.

FIG. 23 is a diagram illustrating an operation of an image sensor according to embodiments.

First, referring to FIG. 23, the image sensor according to embodiments may turn on the first reset transistor RX1 and the second reset transistor RX2 to reset voltages of the first floating diffusion region FD1 and the second floating diffusion region FD2. The second photodiode PD2 may generate electric charge during a second exposure time period de2 over a plurality of times. While the second transfer transistor TX2 is turned on and off, the switching element SW may be turned off. Accordingly, the electric charge of the second photodiode PD2 may not move to the second floating diffusion region FD2 and may be stored in the storage capacitor SC.

Before or while the second photodiode PD2 generates electric charge, the image sensor may turn on and off the first transfer transistor TX1 to perform a shutter operation on the first photodiode PD1. Because the switching element SW is turned off, the shutter operation for the first photodiode PD1 may not affect the second photodiode PD2. When the shutter operation is completed, the first photodiode PD1 may generate electric charge during the first exposure time period de1.

The image sensor according to embodiments controls the second reset transistor RX2 to change the capacity of the floating diffusion region and may detect a sub-pixel voltage corresponding to the electric charge of the first photodiode PD1 twice (i.e. detect a first sub-pixel voltage and a second sub-pixel voltage). Accordingly, the first sub-pixel voltage and the second sub-pixel voltage may be detected under different conversion gain conditions. By changing the capacity of the floating diffusion region to detect the first sub-pixel voltage and the second sub-pixel voltage, the image quality may be prevented from deteriorating due to saturation of the first photodiode PD1 under high illuminance conditions. The image sensor may acquire the first sub-pixel voltage and the second sub-pixel voltage at a first sub-time period DS1 and a second sub-time period DS2 of the first time period D11, respectively.

First, when the first sub-time period DS1 starts during the first exposure time period de1, the image sensor turns off the second reset transistor RX2 to separate the first floating diffusion region FD1 from the second floating diffusion region FD2, and may acquire the first sub-reset voltage from the first floating diffusion region FD1 during a first sampling time t1. When the first sampling time t1 elapses, the image sensor turns on the first transfer transistor TX1, to move the electric charge generated by the first photodiode PD1 during the first exposure time period de1, to the first floating diffusion region FD1, and may detect the first sub-pixel voltage during the second sampling time t2.

Next, when the second sub-time period DS2 starts, the image sensor turns off the first reset transistor RX1 and turns on the second reset transistor RX2 to increase the capacity of the floating diffusion region of the pixel and to lower a conversion gain. Therefore, a relatively greater amount of electric charge may be stored in the floating diffusion region of the pixel. The image sensor turns on the first transfer transistor TX1 to store the electric charge of the first photodiode PD1 in the first floating diffusion region FD1, the second floating diffusion region FD2, the turned-on second reset transistor RX2, and the like.

The image sensor may first detect the second sub-pixel voltage during a third sampling time t3 and detect the second sub-reset voltage during a subsequent fourth sampling time t4. Between the third sampling time t3 and the fourth sampling time t4, the first reset transistor RX1 is turned on to reset the voltages of the first floating diffusion region FD1 and the second floating diffusion region FD2. In this case, as described above with reference to FIG. 21, an operation of temporarily turning off the second reset transistor RX2 may be further performed to offset the coupling effect.

For example, the image sensor may generate first raw data using a difference between a first sub-reset voltage and a first sub-pixel voltage, and a difference between a second sub-reset voltage and a second sub-pixel voltage. The first raw data may be image data corresponding to electric charges generated by the first photodiode PD1 during a longest first exposure time period de1.

At a second time period D21 after the first time period D11, the image sensor may detect a second pixel voltage corresponding to the electric charge of the second photodiode PD2. At the second time period D21, the second reset transistor RX2 may be turned on and the first reset transistor RX1 may be turned off, such that the first floating diffusion region FD1 and the second floating diffusion region FD2 are connected. Electric charges generated by the second photodiode PD2 and stored in the storage capacitor SC during a plurality of second exposure time periods de2 may move to the first floating diffusion region FD1 and the second floating diffusion region FD2 in response to a turn-on operation of the switching element SW. For example, the switching element SW may be turned on after the last second exposure time period de2 elapses. On the other hand, a portion of the transferred electric charges may be stored in the turned-on second reset transistor RX2. Although the example embodiment illustrated in FIG. 23 provides the case in which the switching element SW is turned on together with the second transfer transistor TX2, the switching element SW may also be turned on earlier or later than the second transfer transistor TX2.

While the switching element SW maintains the turn-on state, the image sensor may turn off the second transfer transistor TX2 to remove electric charge from the second photodiode PD2. Also, the image sensor may detect the second pixel voltage during a fifth sampling time t5 and detect the second reset voltage during a sixth sampling time t6 after the fifth sampling time t5. Between the fifth sampling time t5 and the sixth sampling time t6, the image sensor may turn on the first reset transistor RX1 to reset the first floating diffusion region FD1 and the second floating diffusion region FD2.

The image sensor may generate second raw data by calculating a difference between the second pixel voltage and the second reset voltage. The second raw data is data corresponding to the electric charge generated by the second photodiode PD2 during the second exposure time period de2 shorter than the first exposure time period de1 and may be data corresponding to an intermediate exposure time period. In addition, because the second photodiode PD2 is controlled to generate electric charge by setting the second exposure time period (de2) through a plurality of times, an external light source such as an LED or the like, in which flickering occurs, may be accurately captured using the second raw data. The length and number of times of the second exposure time period de2 may be determined in consideration of an operating frequency and duty ratio of an external light source such as an LED.

When entering a third time period D3 after the second time period D21, the image sensor may expose the first photodiode PD1 to light for a third exposure time period de3. The third exposure time period de3 may be shorter than the second exposure time period de2. Similarly to the case of the first time period D11, the first reset transistor RX1 is turned off during the third time period D3, the second reset transistor RX2 is turned on, and the controller may acquire a third reset voltage during a seventh sampling time t7 and a third pixel voltage during a eighth sampling time t8 in sequence. The image sensor may acquire third raw data by using a difference between the third reset voltage and the third pixel voltage.

The image sensor may generate image data by using the first to third raw data. Because the first to third raw data may be obtained using the electric charges generated by the photodiodes PD1 and PD2 during different exposure time periods de1-de3, the first to third raw data may be combined, and thus, the dynamic range of the image sensor may be improved. In addition, by controlling the second photodiode PD2 to generate electric charge over a plurality of second exposure time periods de2, an external light source in which flicker occurs may also be accurately captured. The image data is not limited to being generated using the first to third raw data, but may also be generated using the first and second raw data or using the first to third raw data and additional raw data.

Figure 24:
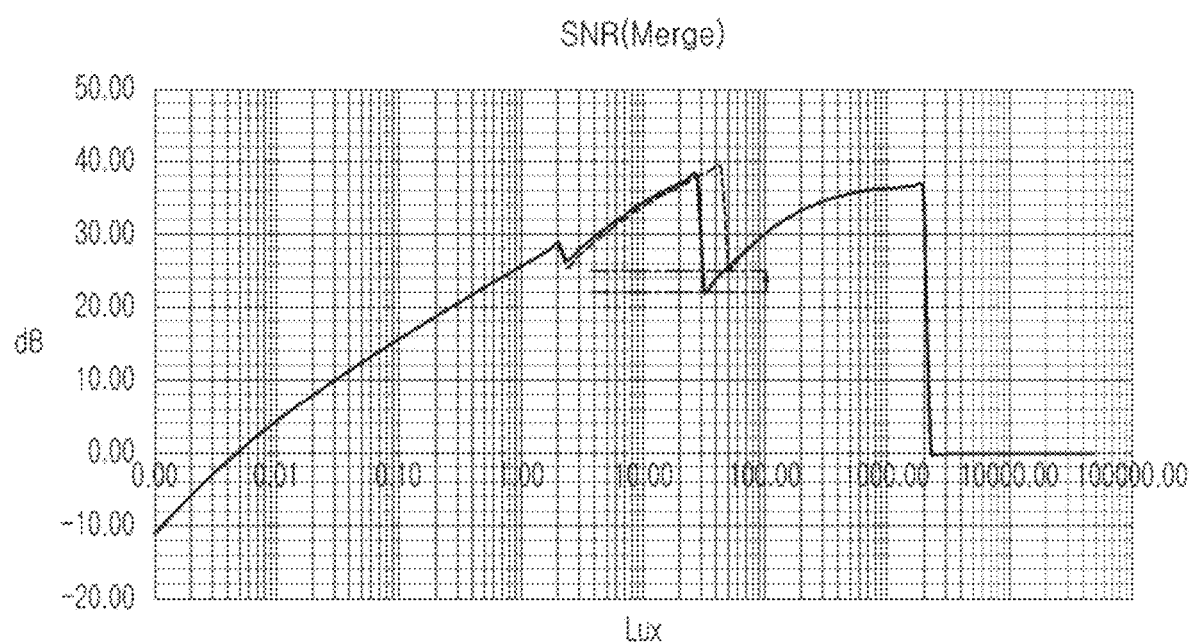
FIG. 24 is a diagram illustrating an effect of an image sensor according to embodiments.

FIG. 24 is a diagram illustrating an effect of the image sensor according to embodiments.

Referring to FIG. 24, in the case of the image sensor according to embodiments, in the case in which the photodiode is used by being divided into a plurality of first photodiodes, the FWC of the first photodiode may increase by about 1.5 to 2 times. As an example, in an image sensor using one first photodiode, a first photodiode of one pixel may store about 10000 to 12000 electrons. On the other hand, in an image sensor using the divided first photodiodes, a plurality of first photodiodes of one pixel may store about 16000 to 20000 electrons. However, this is only embodiments and is not limited thereto, and the number of electrons that may be stored in the first photodiode may vary depending on embodiments. In addition, in the image sensor according to embodiments, the FWC of the first photodiode may increase by two or more times, or may increase by between 1 and 1.5 times.

On the other hand, as the FWC of the first photodiode increases, the illuminance section for combining the pixel signal generated by the first photodiode and the pixel signal generated by the second photodiode may be changed. Accordingly, the SNR dip phenomenon may be improved as illustrated in FIG. 24. However, the graph illustrated in FIG. 24 is only embodiments describing the effect of the image sensor according to embodiments, and is not limited thereto, and the degree of the effect may vary depending on embodiments, and the shape of the graph may also be changed.

FIGS. 25A, 25B, 25C, 25D and 25E are circuit diagrams illustrating pixel circuits of an image sensor according to embodiments.

Embodiments of pixel circuits 200a-200e illustrated in FIGS. 25A to 25E may be modified examples in which as compared to the pixel circuit 200 illustrated in FIG. 9, the storage capacitor SC is not included, or an overflow transistor OX is further included, and/or the first floating diffusion region FD1 is connected to the first reset transistor RX1. The embodiments of the pixel circuits 200a-200e illustrated in FIGS. 25A to 25E may operate based on the operation of the pixel circuit 200 illustrated in FIG. 9, and may have a difference in effects of image sensors according to embodiments by the modification of the pixel circuit 200. In addition, there may be differences in operating methods according to modified devices.

Figure 25A:
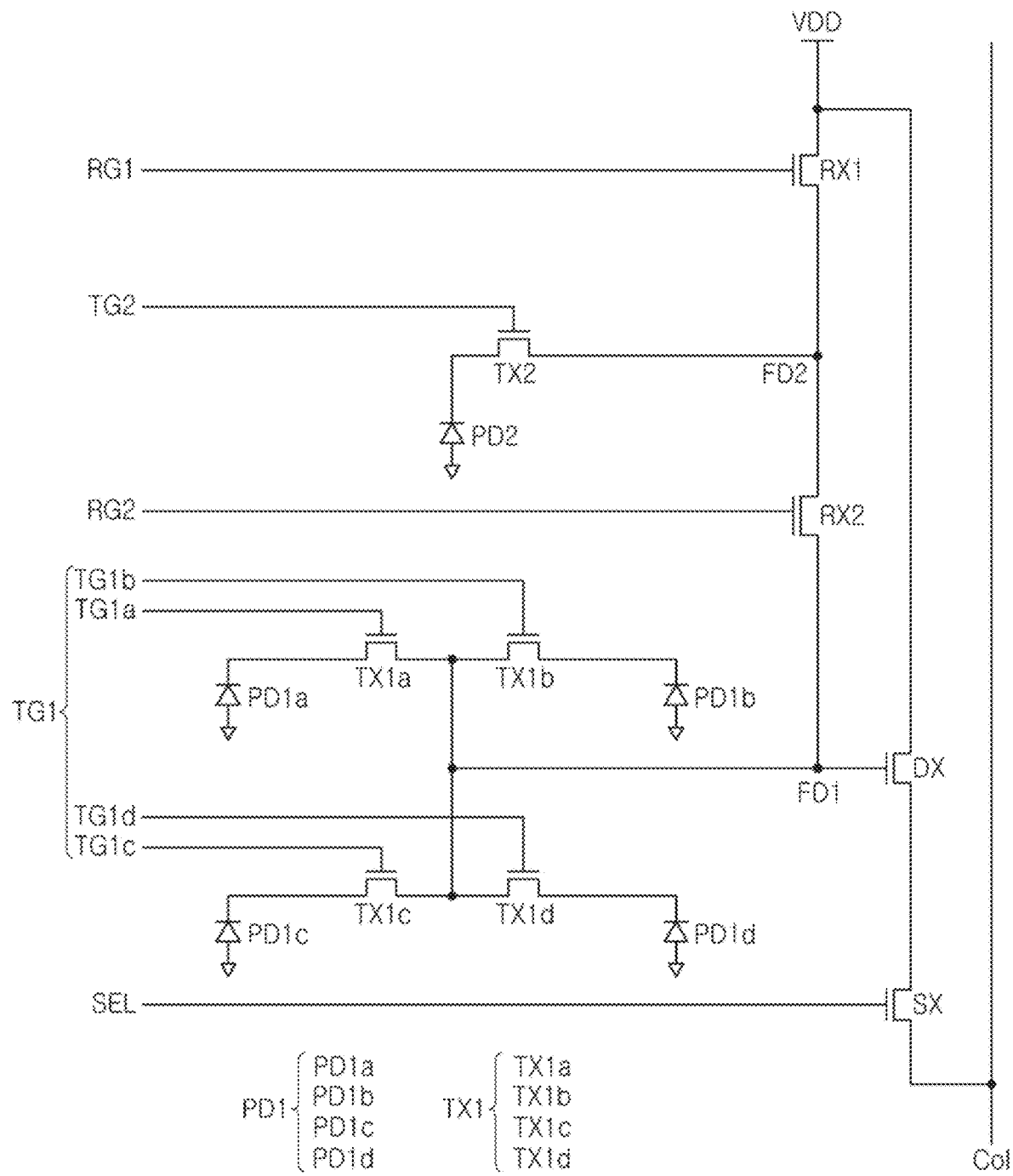
FIGS. 25A, 25B, 25C, 25D and 25E are circuit diagrams illustrating pixel circuits of an image sensor according to embodiments.

For example, referring to FIG. 25A, the pixel circuit 200a of the image sensor according to embodiments may not include the storage capacitor SC as compared to the pixel circuit 200 of FIG. 9. Because the storage capacitor SC is not included, the size of the image sensor may be reduced, but the electric charge generated by the second photodiode PD2 may be easily saturated. On the other hand, electric charges may be directly transferred to the second floating diffusion region FD2 by on/off of the second transfer transistor TX2.

Figure 25B:
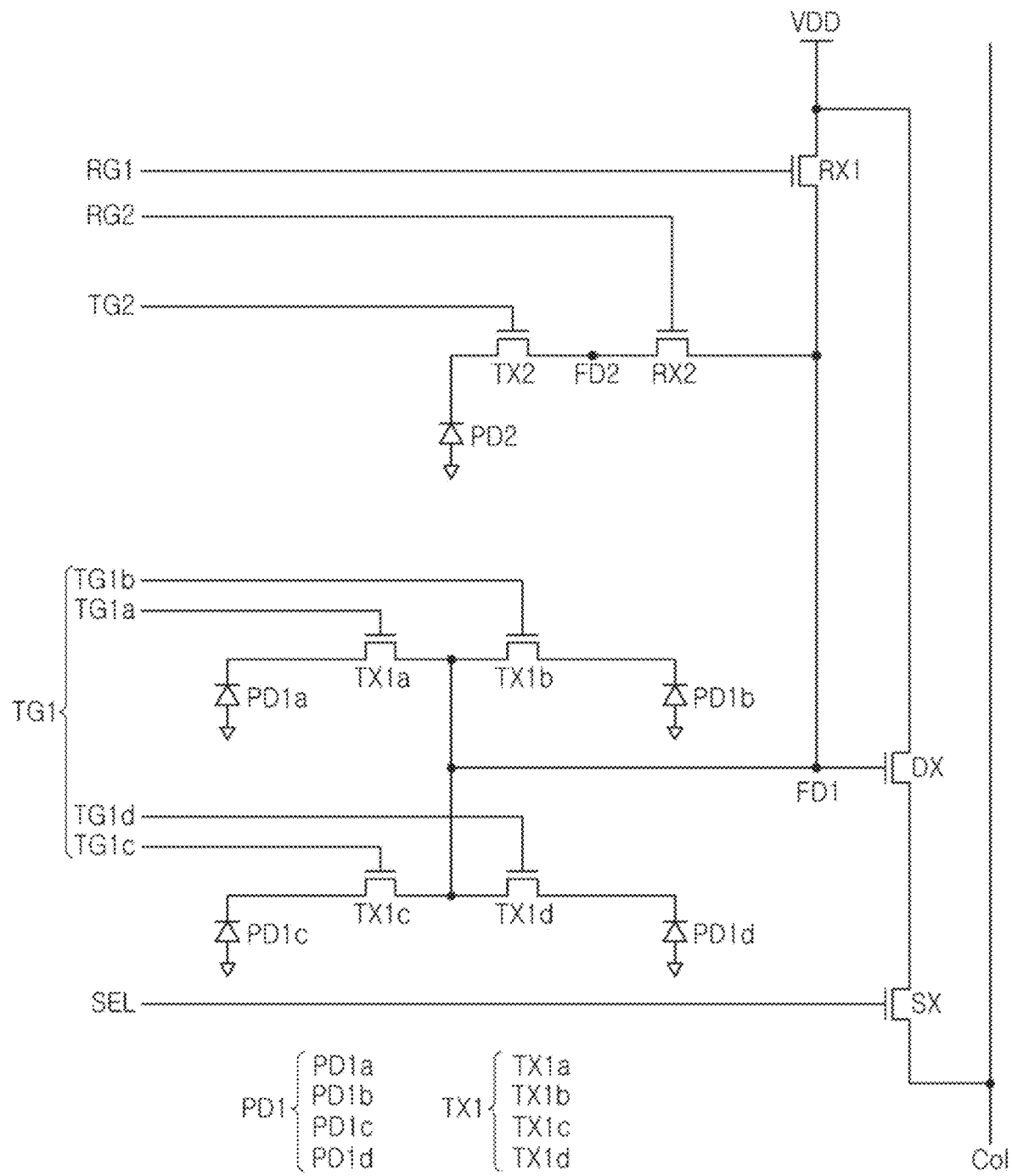

Next, referring to FIG. 25B, compared with the pixel circuit 200a of FIG. 25A, in the case of a pixel circuit 200b of the image sensor according to the example embodiment, a first floating diffusion region FD1 may be connected to the reset transistor RX1. Accordingly, because the capacity of the first floating diffusion region FD1 is significantly increased, electric charges generated by the plurality of first photodiodes PD1a, PD1b, PD1c and PD1d (PD1) may not be easily saturated. However, because the capacity of the second floating diffusion region FD2 is narrowed accordingly, the electric charge generated in the second photodiode PD2 may be easily saturated.

Figure 25C:
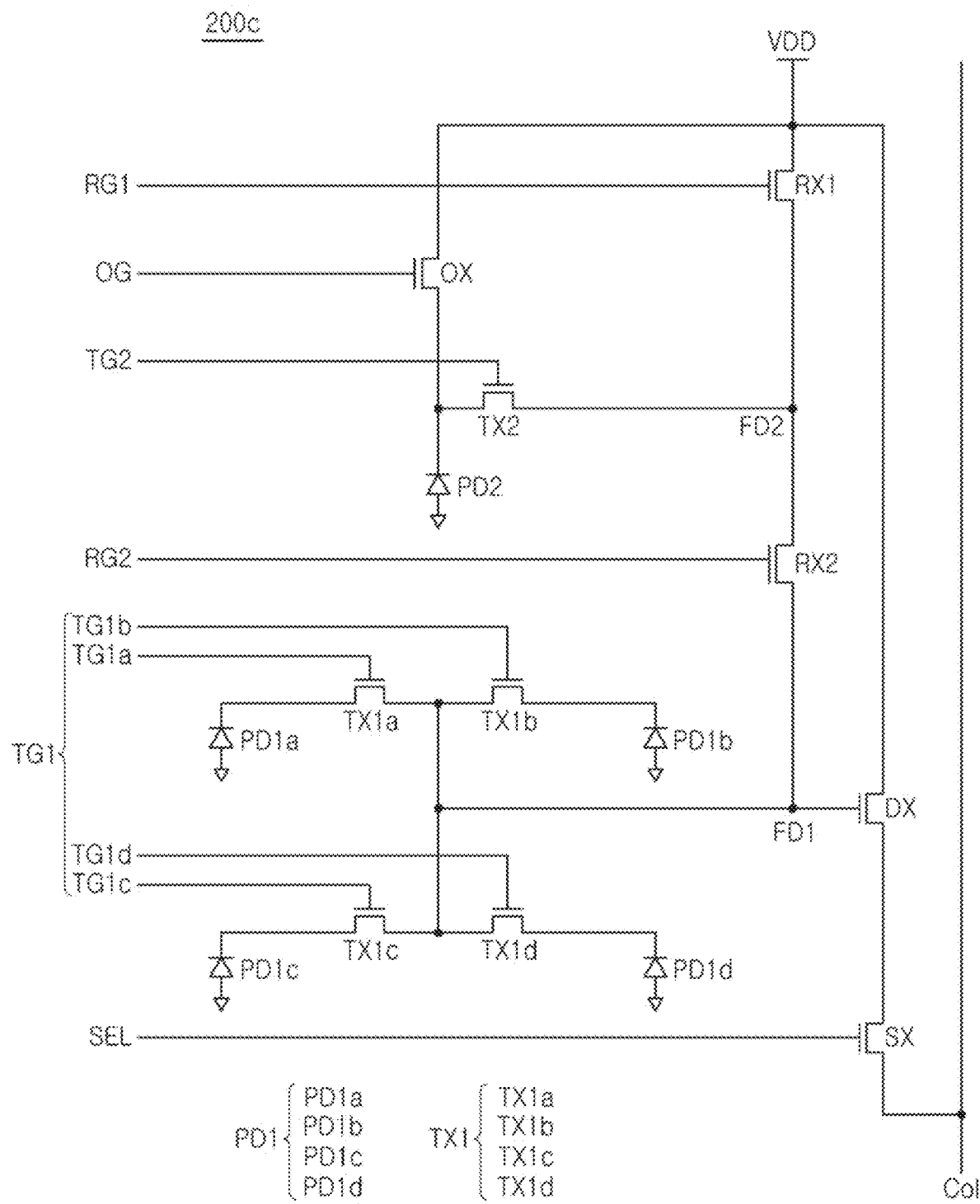

Referring to FIG. 25C, a pixel circuit 200c of an image sensor according to embodiments may further include an overflow transistor OX connected between a second photodiode PD2 and a power node VDD, compared to the pixel circuit 200a of FIG. 25A. For example, the overflow transistor OX may be turned on/off by an overflow control signal OG. The image sensor may control the overflow transistor OX and a second transfer transistor TX2 to be alternately turned on and off to prevent saturation of the second photodiode PD2 and generate electric charge.

Figure 25D:
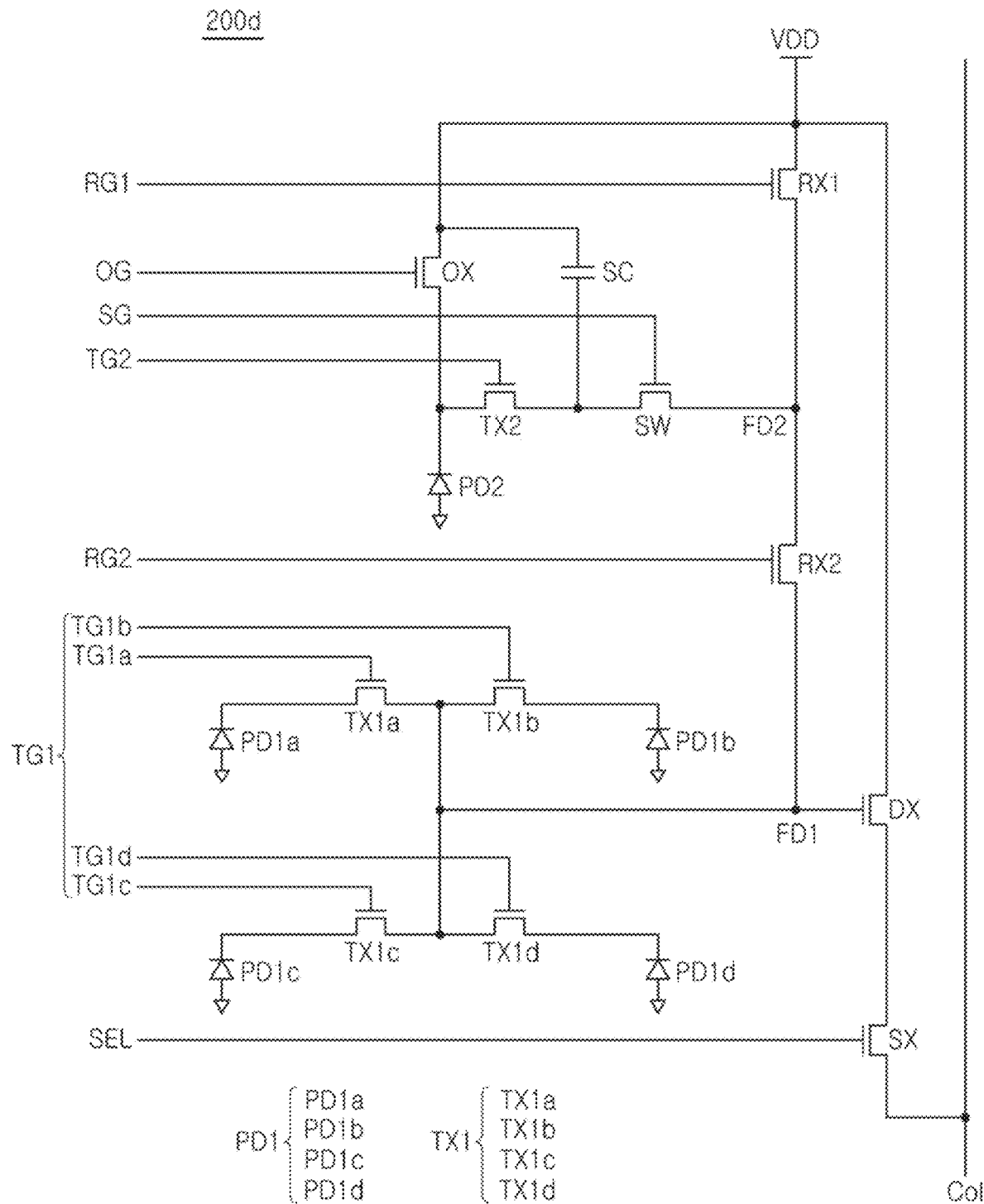

Referring to FIG. 25D, a pixel circuit 200d of the image sensor according to embodiments may further include a storage capacitor SC and a switching element SW, compared to the pixel circuit 200c of FIG. 25C. For example, the storage capacitor SC may be connected between the power node VDD and a node between the second transfer transistor TX2 and the switching element SW. On the other hand, the power node connected to the storage capacitor SC may be a separate power node to which a power supply voltage different from that of the power node VDD of entirety of the image sensor is applied. Unlike the pixel circuit 200c of FIG. 25C, electric charge generated by the second photodiode PD2 may be stored in the storage capacitor SC. On the other hand, to prevent saturation of the second photodiode PD2, the overflow transistor OX and the second transfer transistor TX2 may be alternately turned on/off to generate electric charge, while the switching element SW may be turned off.

Figure 25E:
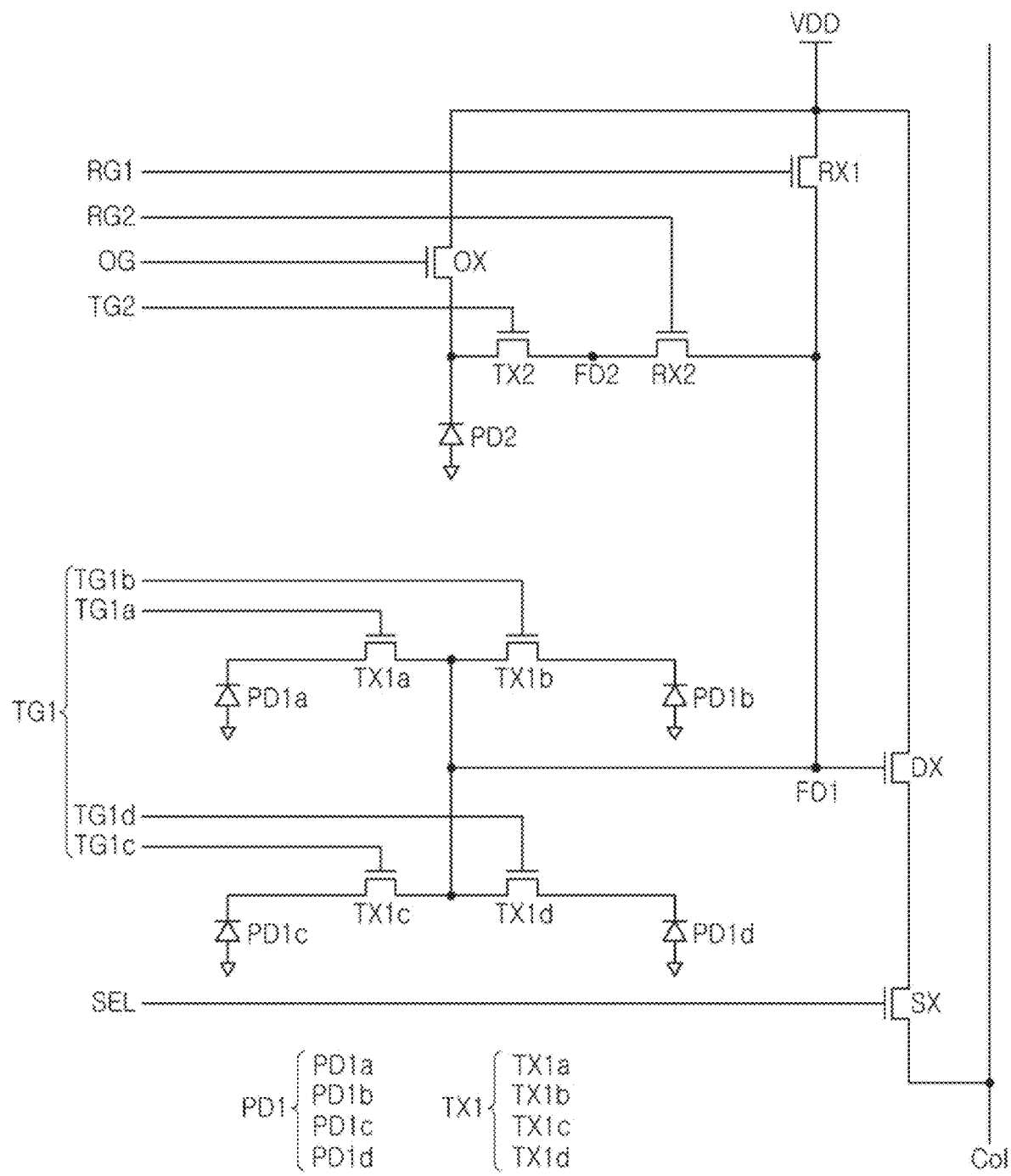

Referring to FIG. 25E, a pixel circuit 200e of the image sensor according to the example embodiment may further include an overflow transistor OX connected between the second photodiode PD2 and the power node VDD, compared with the pixel circuit 200b of FIG. 25B. Advantages and disadvantages according to the circuit structure of the pixel circuit 200e may be similar to those described above.

However, the pixel circuit of the image sensor according to embodiments are not limited to those illustrated in FIGS. 9 and 25A to 25E, and may be designed in various other manners depending on embodiments. For example, various pixel circuits having clearly different advantages and disadvantages depending on the characteristics of the image sensor may be used.

Figure 26:
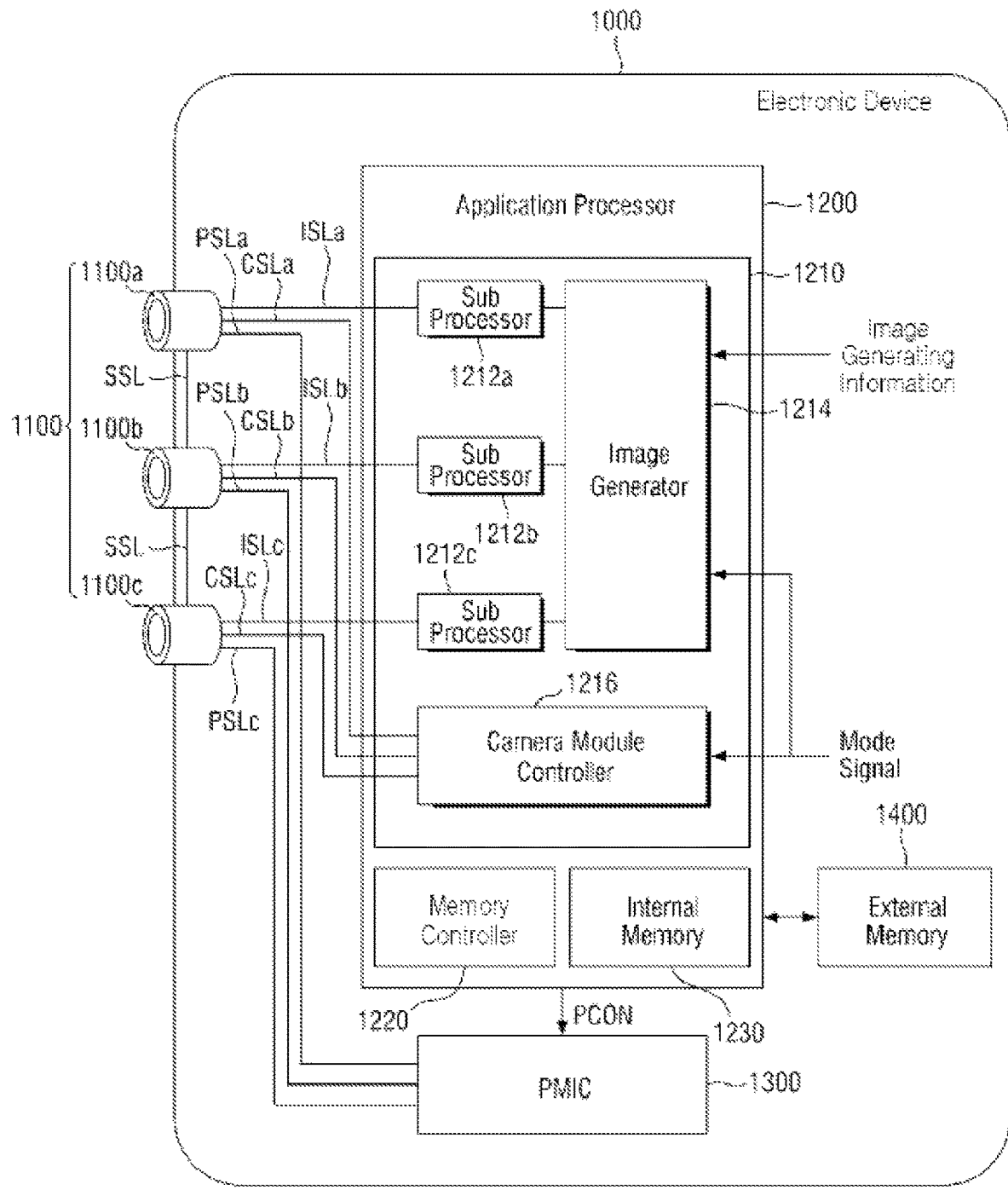
FIGS. 26 and 27 are diagrams schematically illustrating an electronic device including an image sensor according to embodiments.
Figure 27:
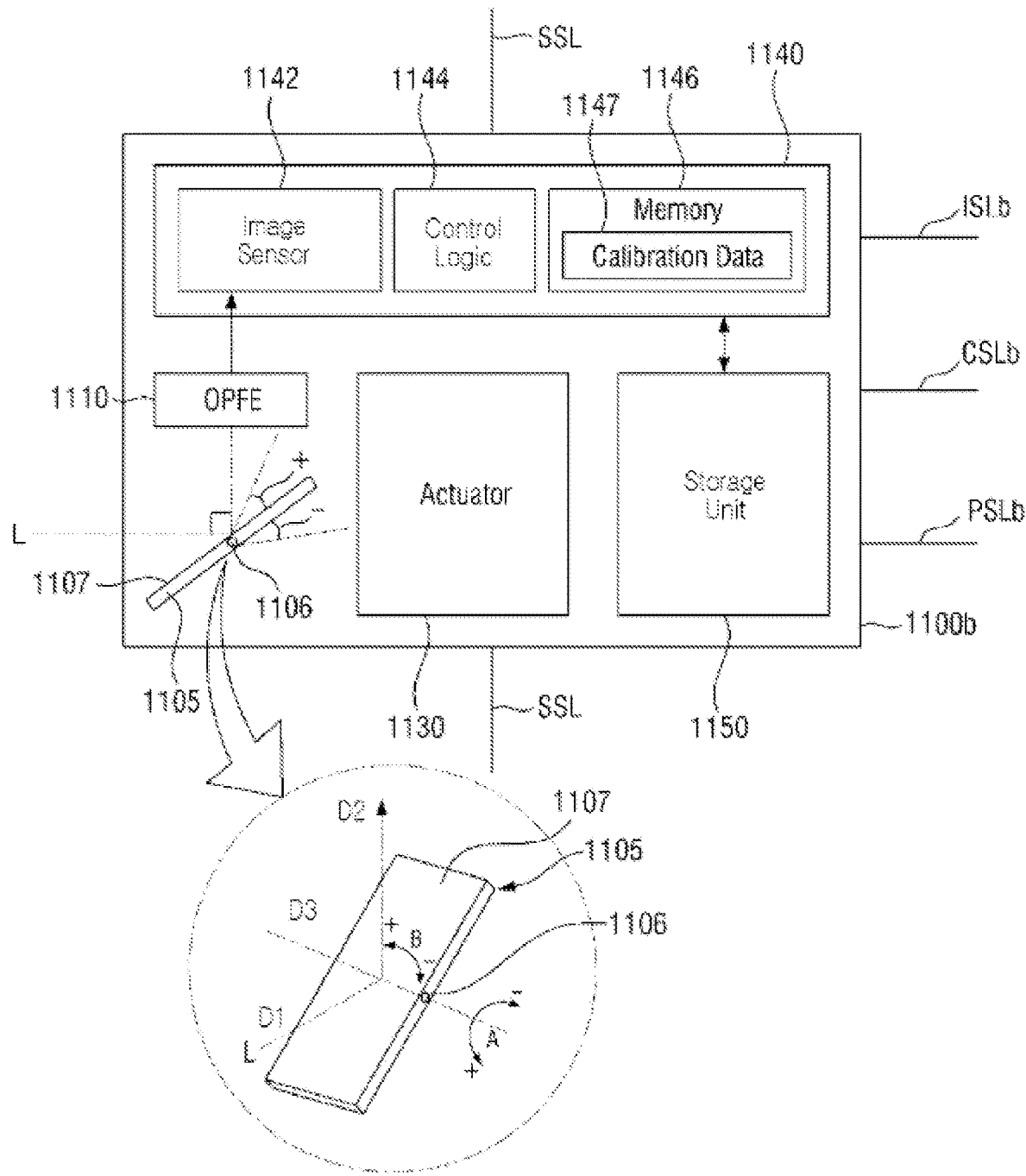

FIGS. 26 and 27 are diagrams schematically illustrating an electronic device including an image sensor according to embodiments.

Referring to FIG. 26, an electronic device 1000 may include a camera module group 1100, an application processor 1200, a power management integrated circuit (PMIC) 1300, and an external memory 1400.

The camera module group 1100 may include a plurality of camera modules 1100a, 1100b and 1100c. Although the drawing illustrates embodiments in which three camera modules 1100a, 1100b and 1100c are disposed, embodiments are not limited thereto. In embodiments, the camera module group 1100 may be modified to include only two camera modules. In addition, in embodiments, the camera module group 1100 may be modified and implemented to include n (where n is a natural number of 4 or more) camera modules. In addition, in embodiments, any one or any combination of the plurality of camera modules 1100a, 1100b and 1100c included in the camera module group 1100 may include an image sensor according to one of the embodiments described with reference to FIGS. 1 to 25E above.

Hereinafter, a detailed configuration of the camera module 1100b will be described in more detail with reference to FIG. 27, but the following description may be equally applied to other camera modules 1100a and 1100c according to embodiments.

Referring to FIG. 27, a camera module 1100b may include a prism 1105, an optical path folding element (hereinafter referred to as "OPFE") 1110, an actuator 1130, an image sensing device 1140, and a storage unit 1150.

The prism 1105 may include a reflective surface 1107 of a light reflecting material to change the path of light L incident externally.

In embodiments, the prism 1105 may change the path of the light L incident in a first direction D1, to a second direction D2 perpendicular to the first direction D1. In addition, the prism 1105 may rotate the reflective surface 1107 of the light reflecting material in A-direction, around a central axis 1106, or may rotate the central axis 1106 in B-direction to change the path of the light L incident in the first direction to a second direction that is a vertical direction. In this case, the OPFE 1110 may also move in a third direction D3 perpendicular to the first direction D1 and the second direction D2.

In embodiments, as illustrated, a maximum rotation angle of the prism 1105 in the A-direction may be 15 degrees or less in the positive (+) A-direction, and may be greater than 15 degrees in the negative (−) A-direction, but embodiments are not limited thereto.

In embodiments, the prism 1105 may move at around 20 degrees, or between 10 degrees and 20 degrees, or between 15 degrees and 20 degrees, in the plus (+) or minus (−) B-direction, and in this case, the angle at which the prism 1105 moves in the plus (+)B-direction and the angle at which the prism 1105 moves in the minus (−) B-direction may be the same, or may be almost the same in the range of around 1 degree.

In embodiments, the prism 1105 may move the reflective surface 1107 of the light reflecting material in a third direction D3 parallel to the extending direction of the central axis 1106.

The OPFE 1110 may include, for example, optical lenses composed of m (where m is a natural number) groups. The m groups of lenses may move in the second direction D2 to change the optical zoom ratio of the camera module 1100b. For example, when the basic optical zoom ratio of the camera module 1100b is Z, and when m groups of optical lenses included in the OPFE 1110 are moved, the optical zoom ratio of the camera module 1100b may be changed to an optical zoom ratio of 3Z, or 5Z, or 5Z or higher.

The actuator 1130 may move the OPFE 1110 or an optical lens to a position. For example, the actuator 1130 may adjust the position of the optical lens such that an image sensor 1142 is positioned at a focal length of the optical lens for accurate sensing.

The image sensing device 1140 may include an image sensor 1142, a control logic 1144, and a memory 1146. The image sensor 1142 may sense an image of a sensing target, using light L provided through an optical lens. The control logic 1144 may control the overall operation of the camera module 1100b. For example, the control logic 1144 may control the operation of the camera module 1100b in response to a control signal provided through a control signal line CSLb.

The memory 1146 may store information for the operation of the camera module 1100b, such as calibration data 1147. The calibration data 1147 may include information for the camera module 1100b to generate image data using light L provided from externally. The calibration data 1147 may include, for example, information on a degree of rotation described above, information on a focal length, information on an optical axis, and the like. For example, when the camera module 1100b is implemented in the form of a multi-state camera of which a focal length is changed depending on the positions of the optical lens, the calibration data 1147 may include focal length values for respective positions (or states) of the optical lens and information related to autofocusing.

The storage unit 1150 may store image data sensed through an image sensor 1142. The storage unit 1150 may be disposed outside of the image sensing device 1140, and may be implemented in a form of being stacked with a sensor chip constituting the image sensing device 1140. In embodiments, the storage unit 1150 may be implemented as an Electrically Erasable Programmable Read-Only Memory (EEPROM), but embodiments are not limited thereto.

Referring to FIGS. 26 and 27 together, in embodiments, each of the plurality of camera modules 1100a, 1100b and 1100c may include the actuator 1130. Accordingly, each of the plurality of camera modules 1100a, 1100b and 1100c may include the same or different calibration data 1147 based on the operation of the actuator 1130 included therein.

In embodiments, one camera module (e.g., 1100b) among the plurality of camera modules 1100a, 1100b and 1100c may be a folded lens-type camera module including the prism 1105 and the OPFE 1110 described above, and the remaining camera modules (e.g., 1100a and 1100c) may be a vertical-type camera module that does not include the prism 1105 and the OPFE 1110, but embodiments are not limited thereto.

In embodiments, one camera module (e.g., 1100c) among the plurality of camera modules 1100a, 1100b and 1100c may be, for example, a vertical-type depth camera to extract depth information using infrared rays (IR). In this case, the application processor 1200 may merge the image data provided from the depth camera with the image data provided from another camera module (for example, 1100a or 1100b) to generate a 3D depth image.

In embodiments, at least two camera modules (e.g., 1100a and 1100b) among the plurality of camera modules 1100a, 1100b and 1100c may have different fields of view. In this case, for example, the optical lenses of at least two camera modules (e.g., 1100a and 1100b) among the plurality of camera modules 1100a, 1100b and 1100c may be different from each other, but are not limited thereto.

Also, in embodiments, the fields of view of the plurality of camera modules 1100a, 1100b and 1100c may be different. In this case, optical lenses included in the plurality of camera modules 1100a, 1100b and 1100c may also be different from each other, but the embodiments are not limited thereto.

In embodiments, the plurality of camera modules 1100a, 1100b and 1100c may be disposed to be physically separated from each other. For example, the sensing area of one image sensor 1142 is not divided and used by the plurality of camera modules 1100a, 1100b and 1100c, but an independent image sensor 1142 may be disposed inside of each of the plurality of camera modules 1100a, 1100b and 1100c.

Referring back to FIG. 26, the application processor 1200 may include an image processing device 1210, a memory controller 1220, and an internal memory 1230. The application processor 1200 may be implemented separately from the plurality of camera modules 1100a, 1100b and 1100c. For example, the application processor 1200 and the plurality of camera modules 1100a, 1100b and 1100c may be implemented by being separated from each other as separate semiconductor chips.

The image processing device 1210 may include a plurality of sub processors 1212a, 1212b and 1212c, an image generator 1214, and a camera module controller 1216.

The image processing device 1210 may include a plurality of sub processors 1212a, 1212b, and 1212c corresponding to the number of the plurality of camera modules 1100a, 1100b and 1100c.

Image data generated by the camera modules 1100a, 1100b and 1100c may be provided to the corresponding sub processors 1212a, 1212b, and 1212c through image signal lines ISLa, ISLb, and ISLc separated from each other, respectively. For example, image data generated by the camera module 1100a may be provided to the sub processor 1212a through an image signal line ISLa, image data generated by the camera module 1100b may be provided to the sub processor 1212b through an image signal line ISLb, and image data generated by the camera module 1100c may be provided to the sub processor 1212c through an image signal line ISLc. Such image data transmission may be performed using, for example, a camera serial interface (CSI) based on a Mobile Industry Processor Interface (MIPI), but embodiments are not limited thereto.

On the other hand, in embodiments, one sub processor may also be disposed to correspond to a plurality of camera modules. For example, the sub processor 1212a and the sub processor 1212c are not implemented separately from each other as illustrated, but may be implemented as a single sub processor, and the image data provided by the camera module 1100a and the camera module 1100c may be selected through a selection element (e.g., multiplexer) or the like, and may then be provided to an integrated sub processor.

Image data provided to the respective sub processors 1212a, 1212b and 1212c may be provided to the image generator 1214. The image generator 1214 may generate an output image using image data provided from the respective sub processors 1212a, 1212b and 1212c according to image generating information or a mode signal.

For example, the image generator 1214 merges at least some of the image data generated by the camera modules 1100a, 1100b and 1100c having different fields of view, according to the image generating information or the mode signal, to generate an output image. Also, the image generator 1214 may generate an output image by selecting any one of image data generated by the camera modules 1100a, 1100b and 1100c having different fields of view, according to image generating information or a mode signal.

In embodiments, the image generating information may include a zoom signal (zoom factor). Further, in embodiments, the mode signal may be, for example, a signal based on a mode selected by a user.

For example, when the image generating information is a zoom signal (zoom factor) and the camera modules 1100a, 1100b and 1100c have different fields of view, the image generator 1214 may perform different operates depending on the types of the zoom signals. For example, when the zoom signal is a first signal, after merging the image data output from the camera module 1100a and the image data output from the camera module 1100c, an output image may be generated using the merged image data and image data output by a camera module 1100b not used for merging. For example, when the zoom signal is a second signal different from the first signal, the image generator 1214 does not perform such image data merging, and selects any one of the image data output from respective camera modules 1100a, 1100b and 1100c, to generate an output image. However, embodiments are not limited thereto, and a method of processing image data may be variously modified and implemented.

In embodiments, the image generator 1214 receives a plurality of image data having different exposure time periods from any one or any combination of the plurality of sub processors 1212a, 1212b and 1212c, and performs high dynamic range (HDR) processing for the plurality of image data, thereby generating merged image data having an increased dynamic range.

The camera module controller 1216 may provide a control signal to the respective camera modules 1100a, 1100b and 1100c. The control signal generated by the camera module controller 1216 may be provided to the corresponding camera modules 1100a, 1100b and 1100c through control signal lines CSLa, CSLb, and CSLc separated from each other.

Any one of the plurality of camera modules 1100a, 1100b and 1100c is designated as a master camera (e.g., 1100b) according to image generating information including a zoom signal or a mode signal, and the remaining camera modules (e.g., 1100a and 1100c) may be designated as slave cameras. Such information may be included in the control signal and may be provided to the corresponding camera modules 1100a, 1100b and 1100c through control signal lines CSLa, CSLb, and CSLc separated from each other.

Camera modules operating as master cameras and slave cameras may be changed according to a zoom factor or an operation mode signal. For example, when the field of view of the camera module 1100a is wider than that of the camera module 1100b and the camera module 1100a has a low zoom ratio of a low zoom factor, the camera module 1100b operates as a master camera, and the camera module 1100a may operate as a slave camera. Conversely, when the zoom factor of the camera module 1100a indicates a high zoom ratio, the camera module 1100a may operate as a master camera and the camera module 1100b may operate as a slave camera.

In embodiments, a control signal provided from the camera module controller 1216 to each of the camera modules 1100a, 1100b and 1100c may include a sync enable signal. For example, when the camera module 1100b is a master camera and the camera modules 1100a and 1100c are slave cameras, the camera module controller 1216 may transmit the sync enable signal to the camera module 1100b. The camera module 1100b receiving the sync enable signal generates a sync signal based on the received sync enable signal, and may provide the generated sync signal to the camera modules 1100a and 1100c through a sync signal line SSL. The camera module 1100b and the camera modules 1100a and 1100c may be synchronized with the sync signal to transmit image data to the application processor 1200.

In embodiments, a control signal provided from the camera module controller 1216 to the plurality of camera modules 1100a, 1100b and 1100c may include mode information according to the mode signal. Based on the mode information, the plurality of camera modules 1100a, 1100b and 1100c may operate in a first operation mode and a second operation mode in relation to the sensing speed.

In the first operation mode, the plurality of camera modules 1100a, 1100b and 1100c may generate an image signal (for example, generate an image signal of a first frame rate) at a first speed, may encode the generated image signal at a second speed higher than the first speed, for example, encode the image signal at a second frame rate higher than the first frame rate, and may transmit the encoded image signal to the application processor 1200. In this case, the second speed may be 30 times or less of the first speed.

The application processor 1200 stores the received image signal, for example, the encoded image signal, in the internal memory 1230 provided therein or in the external memory 1400 outside of the application processor 1200, and then, may read the encoded image signal from the internal memory 1230 or the external memory 1400 and decode the read signal, and may display image data generated based on the decoded image signal. For example, a corresponding sub-processor among the plurality of sub-processors 1212a, 1212b and 1212c of the image processing device 1210 may perform decoding, and may also perform image processing on the decoded image signal.

The plurality of camera modules 1100a, 1100b and 1100c may generate an image signal at a third speed lower than the first speed in the second operation mode, for example, generate an image signal having a third frame rate lower than the first frame rate, and may transmit the image signal to the application processor 1200. The image signal provided to the application processor 1200 may be an unencoded signal. The application processor 1200 may perform image processing on the received image signal or may store the image signal in the internal memory 1230 or the external memory (storage) 1400.

The PMIC 1300 may supply power, such as a power supply voltage, to the plurality of respective camera modules 1100a, 1100b and 1100c. For example, the PMIC 1300 may supply first power to the camera module 1100a through a power signal line PSLa, supply second power to the camera module 1100b through a power signal line PSLb, and supply third power to the camera module 1100c through a power signal line PSLc, under the control of the application processor 1200.

The PMIC 1300 may generate power corresponding to the plurality of respective camera modules 1100a, 1100b and 1100c in response to a power control signal PCON from the application processor 1200, and may also adjust the level of power. The power control signal PCON may include a power adjustment signal for each operation mode of the plurality of camera modules 1100a, 1100b and 1100c. For example, the operation mode may include a low power mode, and in this case, the power control signal PCON may include information on a camera module operating in a low power mode and a set power level. Levels of powers provided to the plurality of respective camera modules 1100a, 1100b and 1100c may be the same or different from each other. Also, the level of power may be dynamically changed.

As set forth above, an image sensor according to embodiments may accurately detect light from an external light source in which flicker occurs, using electric charges generated by a plurality of first photodiodes and a second photodiode included in each of a plurality of pixels. In addition, Full Well Capacity (FWC) of the plurality of first photodiodes may be increased, and noise characteristics of light from an external light source in which a flicker phenomenon occurs may be improved, while increasing an image sensor dynamic range.

While embodiments have been illustrated and described above, it will be apparent to those skilled in the art that modifications and variations could be made without departing from the scope of the inventive concept as defined by the appended claims.

What is claimed is:

1. An image sensor comprising:
a plurality of first photodiodes included in a first area of a unit pixel;
a second photodiode included in a second area of the unit pixel;
a first microlens disposed above the first area;
a second microlens disposed above the second area;
a first floating diffusion region included in the first area comprising the plurality of first photodiodes;
a second floating diffusion region included in the second area comprising the second photodiode;
a plurality of first transfer transistors configured to provide electric charges generated by the plurality of first photodiodes to the first floating diffusion region; and
a second transfer transistor configured to provide electric charges generated by the second photodiode to the second floating diffusion region,
wherein a sum of light-receiving areas of the plurality of first photodiodes is greater than a light-receiving area of the second photodiode.

2. The image sensor of claim 1, further comprising a color filter disposed above and shared by the plurality of first photodiodes and the second photodiode.

3. The image sensor of claim 1, wherein the plurality of first transfer transistors are disposed in a position that significantly reduces a distance between the plurality of first photodiodes and the first floating diffusion region, through which the electric charges generated by the plurality of first photodiodes move.

4. The image sensor of claim 1, wherein an area of the first microlens is greater than an area of the second microlens.

5. The image sensor of claim 1, further comprising a device isolation layer interposed between the plurality of first photodiodes and the second photodiode.

6. The image sensor of claim 1, wherein the image sensor is configured to:
detect a first pixel voltage corresponding to the electric charges generated by the plurality of first photodiodes during a first exposure time period;
detect a second pixel voltage corresponding to the electric charges generated by the second photodiode while repeating a second exposure time period less than the first exposure time period a plurality of times; and
generate image data for the unit pixel based on the detected first pixel voltage and the detected second pixel voltage.

7. The image sensor of claim 6, wherein the image sensor is further configured to detect a third pixel voltage corresponding to the electric charges generated by the plurality of first photodiodes during a third exposure time period less than the second exposure time period, and generate the image data for the unit pixel based on the detected first pixel voltage, the detected second pixel voltage, and the detected third pixel voltage.

8. The image sensor of claim 1, wherein the image sensor is configured to:
during a first time period, sequentially detect a first reset voltage and a first pixel voltage corresponding to the electric charges generated by the plurality of first photodiodes being moved to the first floating diffusion region; and
during a second time period after the first time period:
detect a second pixel voltage corresponding to the electric charges generated by the second photodiode being moved to the first floating diffusion region; and
after the second pixel voltage is detected, detect a second reset voltage corresponding to the first floating diffusion region being reset.

9. The image sensor of claim 8, wherein first raw data is generated based on a difference between the detected first reset voltage and the detected first pixel voltage,
wherein second raw data is generated based on a difference between the detected second reset voltage and the detected second pixel voltage, and
wherein image data, in which a light source having a flicker phenomenon is reflected, is generated based on the first raw data and the second raw data.

10. The image sensor of claim 8, wherein the first time period comprises a first sub-time period and a second sub-time period after the first sub-time period,
wherein the image sensor is further configured to:
during the first sub-time period, detect a first sub-pixel signal corresponding to a capacity of a floating diffusion region of the unit pixel being adjusted to a capacity of the first floating diffusion region;
during the second sub-time period, detect a second sub-pixel signal corresponding to the capacity of the floating diffusion region being adjusted to a sum of the capacity of the first floating diffusion region and a capacity of the second floating diffusion region,
generate first raw data based on the detected first sub-pixel signal and the detected second sub-pixel signal,
generate second raw data based on a difference between the detected second reset voltage and the detected second pixel voltage, and
generate image data based on the first raw data and the second raw data.

11. The image sensor of claim 8, wherein the image sensor is further configured to, during a third time period after the second time period, sequentially detect a third reset voltage and a third pixel voltage corresponding to the electric charges generated by the plurality of first photodiodes being moved to the first floating diffusion region,
wherein first raw data is generated based on a difference between the first reset voltage and the first pixel voltage,
wherein second raw data is generated based on a difference between the second reset voltage and the second pixel voltage,
wherein third raw data is generated based on a difference between the third reset voltage and the third pixel voltage, and
wherein image data, in which a light source having a flicker phenomenon is reflected, is generated based on the first raw data, the second raw data and the third raw data.

12. An image sensor comprising:
a plurality of first photodiodes connected to a first floating diffusion region, respectively via a plurality of first transfer transistors;

a second photodiode connected to a second floating diffusion region separate from the first floating diffusion region, via a second transfer transistor;

a first reset transistor connected between the second floating diffusion region and a first power node;

a second reset transistor connected between the first floating diffusion region and the second floating diffusion region;

a switching element connected between the second transfer transistor and the second floating diffusion region; and a storage capacitor connected between a second power node and a node interposed between the second transfer transistor and the switching element, wherein the plurality of first photodiodes and the second photodiode are included for each unit pixel.

13. The image sensor of claim 12, further comprising:
at least one first microlens disposed above the plurality of first photodiodes; and
a second microlens disposed above the second photodiode.

14. The image sensor of claim 12, further comprising:
a driving transistor configured to generate a pixel signal, based on electric charges that are accumulated in the first floating diffusion region; and
a selection transistor configured to output the generated pixel signal.

15. The image sensor of claim 12, further comprising an overflow transistor connected between the second photodiode and the first power node, and configured to prevent saturation of the second photodiode.

16. The image sensor of claim 15, wherein the storage capacitor is configured to store electric charges that is generated by the second photodiode by alternately turning on and off the overflow transistor and the second transfer transistor, and
wherein the image sensor is further configured to detect a pixel signal corresponding to the electric charges stored in the storage capacitor, by turning on the switching element.

17. The image sensor of claim 12, wherein a first voltage that is input to the first power node is greater than or equal to a second voltage that is input to the second power node.

18. An image sensor comprising:
N first photodiodes included in a unit pixel;
a second photodiode included in the unit pixel;
a color filter disposed above and shared by the N first photodiodes and the second photodiode;
M first microlenses disposed above the N first photodiodes, where M is less than or equal to N;
a second microlens disposed above the second photodiode;
a first floating diffusion region;
a second floating diffusion region separate from the first floating diffusion region;
a plurality of first transfer transistors configured to provide electric charges that are accumulated in the N first photodiodes, to the first floating diffusion region; and
a second transfer transistor configured to provide electric charges that are accumulated in the second photodiode, to the second floating diffusion region.

19. The image sensor of claim 18, wherein a center point of each of the M first microlenses does not overlap the first floating diffusion region in a vertical direction, and
wherein the first floating diffusion region is placed at or near a boundary of the each of the M first microlenses.

20. The image sensor of claim 18, further comprising a pixel circuit connected to the N first photodiodes and the second photodiode,
wherein the pixel circuit is configured to generate pixel signals corresponding to the electric charges accumulated in the N first photodiodes and the electric charges accumulated in the second photodiode, respectively, to generate an image in which a flicker phenomenon is mitigated.

* * * * *